(12) United States Patent
Li et al.

(10) Patent No.: US 12,206,038 B2
(45) Date of Patent: Jan. 21, 2025

(54) PIN DIODE DETECTOR, METHOD OF MAKING THE SAME, AND SYSTEM INCLUDING THE SAME

(71) Applicants: TAIWAN SEMICONDUCTOR MANUFACTURING COMPANY, LTD., Hsinchu (TW); TSMC CHINA COMPANY, LIMITED, Shanghai (CN)

(72) Inventors: Lianjie Li, Hsinchu (TW); Feng Han, Hsinchu (TW); Lu Zhang, Hsinchu (TW); Shengtian Lu, Hsinchu (TW); LinChun Gui, Hsinchu (TW); Chenglin Zhang, Hsinchu (TW)

(73) Assignees: TAIWAN SEMICONDUCTOR MANUFACTURING COMPANY, LTD, Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 419 days.

(21) Appl. No.: 17/827,571

(22) Filed: May 27, 2022

(65) Prior Publication Data
US 2023/0378389 A1 Nov. 23, 2023

(30) Foreign Application Priority Data
May 20, 2022 (CN) .......................... 202210552119.4

(51) Int. Cl.
*H01L 31/105* (2006.01)
*G01T 1/24* (2006.01)
(Continued)

(52) U.S. Cl.
CPC .............. *H01L 31/105* (2013.01); *G01T 1/24* (2013.01); *H01L 27/14641* (2013.01); *H01L 27/14658* (2013.01); *H01L 31/0304* (2013.01)

(58) Field of Classification Search
None
See application file for complete search history.

(56) References Cited

U.S. PATENT DOCUMENTS 8,058,111 B2 11/2011 Langguth et al.
9,583,665 B2 * 2/2017 Kundalgurki ......... H01L 31/115
(Continued)

FOREIGN PATENT DOCUMENTS

CN 102714226 A * 10/2012 ......... H01L 29/0619
CN 105870205 A * 8/2016
(Continued)

*Primary Examiner* — Michael Lebentritt
(74) *Attorney, Agent, or Firm* — Hauptman Ham, LLP

(57) ABSTRACT

A PIN diode detector includes a substrate. The PIN diode detector further includes a plurality of PIN diode wells in a pixel region, wherein each of the plurality of PIN diode wells has a first dopant type. The PIN diode detector further includes a connecting ring well and a plurality of floating ring wells in a peripheral region, wherein the connecting ring well and plurality of floating ring wells have the first dopant type. The PIN diode detector further includes a field stop ring well surrounding the plurality of floating ring wells, wherein the field stop ring well has a second dopant type opposite the first dopant type. The PIN diode detector further includes a blanket doped region. The blanket doped region extends continuously through an entirety of the pixel region and an entirety of the peripheral region, and the blanket doped region has the second dopant type.

20 Claims, 16 Drawing Sheets

(51) Int. Cl.
    *H01L 27/146*    (2006.01)
    *H01L 31/0304*    (2006.01)

(56)     References Cited

U.S. PATENT DOCUMENTS

| | | | |
|---|---|---|---|
| 11,101,137 B1* | 8/2021 | Niu | H01L 27/0727 |
| 2003/0173561 A1 | 9/2003 | Sieben et al. | |
| 2009/0218621 A1* | 9/2009 | Pfirsch | H01L 29/0653 |
| | | | 257/E29.256 |
| 2011/0175199 A1* | 7/2011 | Lin | H01L 29/0692 |
| | | | 257/605 |
| 2012/0319240 A1* | 12/2012 | Su | H01L 21/26513 |
| | | | 257/E29.326 |
| 2013/0056623 A1 | 3/2013 | Lipson et al. | |
| 2019/0035909 A1* | 1/2019 | Schmidt | C30B 31/22 |
| 2021/0111205 A1 | 4/2021 | Aliane et al. | |
| 2021/0234058 A1 | 7/2021 | Zhang et al. | |

FOREIGN PATENT DOCUMENTS

| | | | | |
|---|---|---|---|---|
| CN | 117116978 A | * | 11/2023 | |
| EP | 2924734 A1 | * | 9/2015 | H01L 27/0629 |
| KR | 10-2014-0055933 | | 5/2014 | |
| KR | 10-2015-0063881 | | 6/2015 | |
| KR | 10-2019-0054911 | | 5/2019 | |
| KR | 10-2022-0019598 | | 2/2022 | |

\* cited by examiner

PIN DIODE DETECTOR, METHOD OF MAKING THE SAME, AND SYSTEM INCLUDING THE SAME

BACKGROUND

PIN diodes are formed by an undoped, or lightly doped, semiconductor region between a n-type doped region and a p-type doped region. PIN diodes are usable for detecting photons of various energy levels. Photodetectors that include PIN diodes include a detection or pixel region surrounded by a peripheral region. The detection region is where photons are converted into electrical signals. The peripheral region is where logic devices, seal rings, isolation structures, or other types of structures are located. The photodetectors include doped wells having different dopant types in a substrate that is undoped or lightly doped. The doping concentration in the substrate, outside of the doped wells, is substantially constant throughout the substrate.

During manufacturing, various wells and other structures are formed on a wafer. The wafer contains a large number of devices, such as photodetectors, spread across the wafer. The wafer is diced in order to separate the devices from one another in order to incorporate the device into an integrated circuit or system. The dicing process uses a saw, in some instances, that cuts through the substrate in order to separate the devices from one another. This dicing process introduces defects into the crystal structure of the substrate. These defects provide pathways for current leakage once the device is incorporated into the integrated circuit or system.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
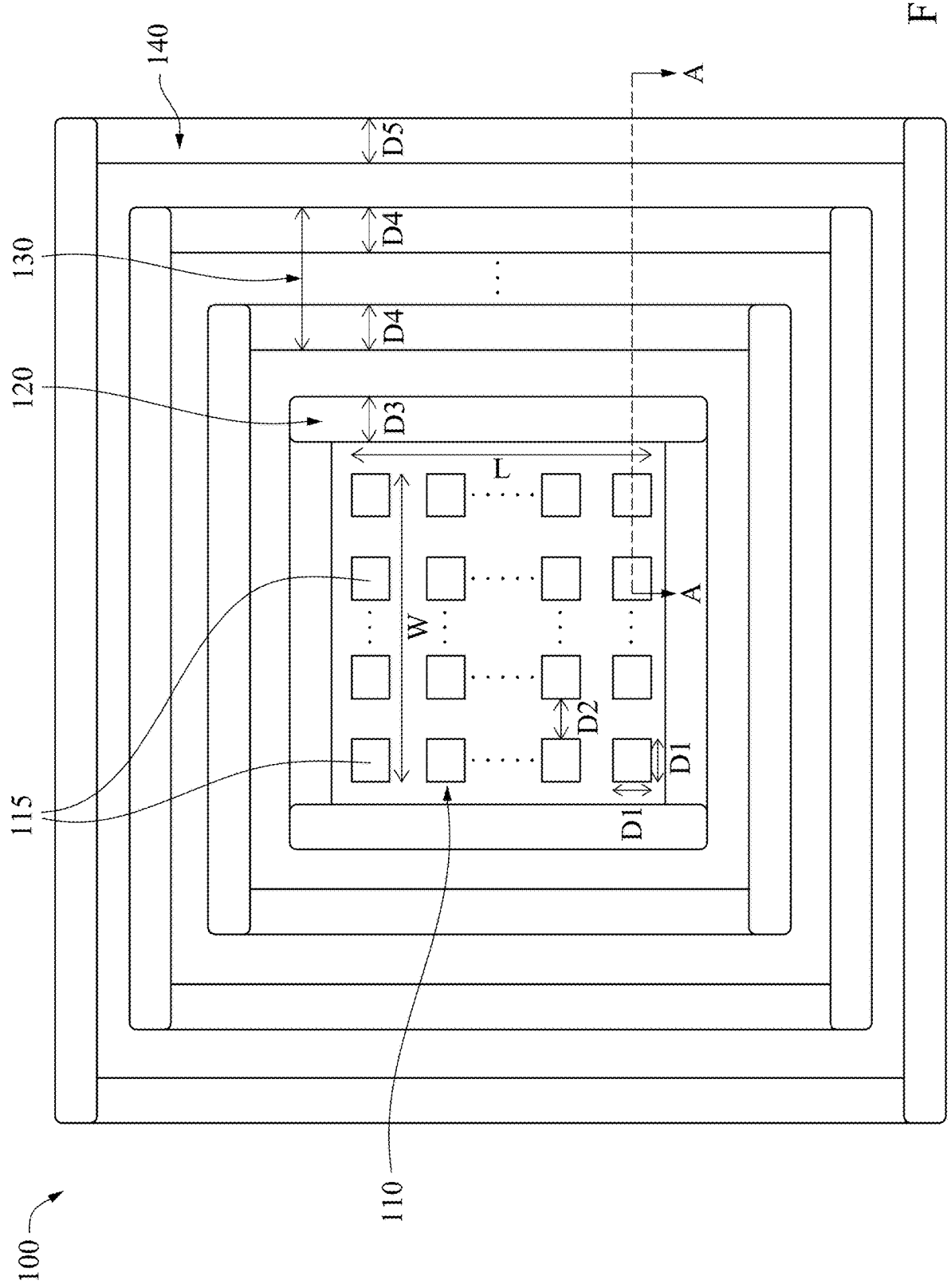
FIG. 1A is a top view of a PIN diode detector, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

PIN diodes have a substantially uniform substrate dopant concentration in a thickness direction. Wells formed therein have an increased risk of increased current leakage and lower breakdown voltage due to current paths formed by damage to the crystal structure of the substrate during a dicing process. PIN diodes have a depletion region under the detector or pixel region to allow the detection of photons incident on the PIN diode. In PIN diodes having the substantially uniform substrate dopant concentration in the thickness direction, the depletion region extends from the detection or pixel region through a peripheral region and into a region where the wafer is diced to separate PIN diodes formed on a same wafer.

As mentioned above, the dicing process damages the crystal structure of the substrate. The damaged crystal structure provides more pathways for charge carriers to move through the substrate. When the depletion region reaches the damaged crystal structure of the substrate, current leakage within the substrate increases. As a result of the increased current leakage, the breakdown voltage for the PIN diode decreases. The lower breakdown voltage increases a risk of defects forming transistors of the PIN diode during operation as a detector or within other implementations. Defects within the PIN diode increase a risk of inaccurate capture of images and even total device failure.

In order to reduce a distance a depletion region extends beyond a pixel or detection region, a blanket implantation of dopants across the PIN diode is included. A dopant type of the blanket implantation is opposite to a dopant type used in wells of photodiodes within the detection or pixel region. In some embodiments where the substrate is lightly doped, the dopant type of the blanket implant is a same dopant type as the dopant included in the substrate. By including this blanket dopant layer in the substrate, a size of the depletion region outside of the detection or pixel region is reduced. The reduced depletion region does not reach the portion of the substrate damaged by the dicing process. As a result, charge carriers in the depletion region are not able to use the increased number of current pathways in the damaged region to increase current leakage and reduce breakdown voltage.

The inclusion of the blanket doped region helps to produce a PIN diode that exhibits a current leakage and breakdown voltage consistent with a designed performance. By having the performance of the PIN diode more closely match the designed performance, over design of the PIN diode is reduced, which reduces production time and cost. Over design means that the PIN diode without the blanket doped region would be manufactured to have an artificially high break down voltage so that the device actually produced would meet the specifications for the PIN diode in operation. Avoiding over design saves production cost and provides a customer with a device that is consistently meets desired performance specifications.

FIG. 1A is a top view of a PIN diode detector 100, in accordance with some embodiments. The PIN diode detector 100 includes a pixel or detection region 110. For the sake of simplicity, the description will use pixel region 110. The pixel region 110 includes a plurality of PIN diodes 115 in a two-dimensional array. The pixel region 110 is surrounded by a connecting ring 120. The connecting ring 120 is surrounded by a plurality of floating rings 130. Each of the pixel region 110, the connecting ring 120, and the plurality of floating rings 130 includes doped wells having a same dopant type. The plurality of floating rings 130 is surrounded by a field stop ring 140. The field stop ring 140 includes a doped well having a dopant type different from the pixel region 110, the connecting ring 120 and the plurality of floating rings 130. The field stop ring 140 is a location where the PIN diode detector 100 would be diced to separate the PIN diode detector 100 from other PIN diode detectors on a same wafer.

Each of the PIN diodes 115, connecting ring 120, plurality of floating rings 130 and field stop ring 140 include doped wells. At least some of the PIN diodes 115, the connecting ring 120, the plurality of floating rings 130, or the field stop ring 140 include additional components, such as a gate structure for the PIN diodes 115. For the sake of simplicity, any reference to the PIN diodes 115, the connecting ring 120, the plurality of floating rings 130, or the field stop ring 140 is a reference to the doped wells that are at least part of these elements unless otherwise stated.

The PIN diodes 115 are arranged in an array including columns and rows. The array has a width W in a row direction and a length L in a column direction. In some embodiments, the width W ranges from about 8,000 microns (μm) to about 500,000 μm. In some embodiments, the length L ranges from about 8,000 μm to about 500,000 μm. As the width W or the length L increases, a size of the pixel region 110 increases allowing for the capture of a wider area of electromagnetic energy. However, the increased size of the pixel region 110 also increases an overall size of the PIN diode detector 100 which makes the device unable to be integrated into some systems, in some instances. In some embodiments, the width W is equal to the length L. In some embodiments, the width W is different from the length L. Each of the PIN diodes 115 has a dimension D1 that is substantially equal in both the row direction and the column direction. In some embodiments, the dimension D1 ranges from about 20 μm to about 50 μm. If the dimension D1 is too small, then a risk of failing to properly capture incident electromagnetic energy increases, in some instances. If the dimension D1 is too large, resolution precision of the PIN diode detector 100 decreases because pixel sizes are increased, in some instances. In some embodiments, every PIN diode 115 has a same size. In some embodiments, at least one PIN diode 115 has a different size from at least one other PIN diode 115. The PIN diodes 115 are separated from one another by a pitch D2. In some embodiments, the pitch D2 ranges from about 20 μm to about 50 μm. If the pitch D2 is too small, then a risk of cross-talk between adjacent PIN diodes 115 increases, in some instances. If the pitch D2 is too large, then a risk of failure to accurately capture the incident electromagnetic radiation increases, in some instances. In some embodiments, a pitch in a row direction of the pixel region 110 is equal to a pitch in a column direction of the pixel region 110. In some embodiments, the pitch in the row direction of the pixel region 110 is different from the pitch in the column direction of the pixel region 110.

Each of the PIN diodes 115 includes a doped well having a same dopant type. In some embodiments, the dopant type is p-type dopants. In some embodiments, the dopant type is n-type dopants. This description focuses on wells within a substrate. However, one of ordinary skill in the art would understand that additional elements, such as gate structures are also included for each of the PIN diodes 115. Further, one of ordinary skill in the art would understand that additional circuitry, such as logic circuits, drivers, etc. is present in the PIN diode detector 100 in order to implement the functionality of capturing electromagnetic radiation, generating electrical signals based on the captured electromagnetic radiation, and processing of the generated electrical signals.

The connecting ring 120 surrounds the pixel region 110. The connecting ring 120 includes a continuous doped well that surrounds the pixel region 110. The connecting ring 120 helps to reduce leakage current from the pixel region 110. The doped well has the same dopant type as the wells in the pixel region 110. A width D3 of the connecting ring ranges from about 50 μm to about 100 μm. If the width D3 is too small, then a risk of the current leakage reaching an unacceptable level increases, in some instances. If the width D3 is too large, then a size of the PIN diode detector 100 increases without noticeable improvement to device performance, in some instances.

The plurality of floating rings 130 surrounds the connecting ring 120. Each of the plurality of floating rings 130 includes a continuous doped well that collectively surround the connecting ring 120 in a concentric pattern. The doped well for each of the plurality of floating rings 130 has a same dopant type as the connecting ring 120 and the PIN diodes 115. The plurality of floating rings 130 helps to control an electric field at a periphery of the device to improve precision of electromagnetic radiation processing. In some embodiments, a number of floating rings in the plurality of floating rings 130 ranges from about 2 to about 10. If the number of floating rings is too small, then an ability of the plurality of floating rings 130 to effectively control the electric field is reduced, in some instances. If the number of floating rings is too large then an overall size of the PIN diode detector 100 is increased without a noticeable improvement to device performance, in some instances. A width D4 of each floating ring of the plurality of floating rings 130 ranges from about 20 μm to about 40 μm. If the width D3 is too small, then the floating ring would be unable to effectively control the electric field, in some instances. If the width D3 is too large, then the size of the PIN diode detector 100 is increased without a noticeable improvement in device performance, in some instances. In some embodiments, each of the plurality of floating rings 130 has a same width. In some embodiments, at least one floating ring has a different width from at least one other floating ring of the plurality of floating rings 130. A pitch between adjacent floating rings of the plurality of floating rings 130 ranges from about 20 µm to about 100 µm. If the pitch among the plurality of floating rings 130 is too small, then an ability of the plurality of floating rings 130 to effectively control the electric field is reduced, in some instances. If the pitch among the plurality of floating rings 130 is too large, then a size of the PIN diode detector 100 is increased without a noticeable improvement in device performance, in some instances.

A dopant concentration of the doped wells for each of the PIN diodes 115, the connecting ring 120 and each of the plurality of floating rings 130 ranges from $1 \times 10^{12}$ dopants/$cm^3$ to $1 \times 10^{14}$ dopants/$cm^3$. If the dopant concentration is too low, then breakdown voltage of the PIN diode detector 100 following dicing is too low, in some instances. If the dopant concentration is too high, then production costs are increased without a noticeable improvement in device performance, in some instances. In some embodiments, the dopant concentration for each of the PIN diodes 115, the connecting ring 120 and each of the plurality of floating rings 130 is the same. In some embodiments, at least one doped well among each of the PIN diodes 115, the connecting ring 120 and each of the plurality of floating rings 130 has a different dopant concentration from another of the doped wells among each of the PIN diodes 115, the connecting ring 120 and each of the plurality of floating rings 130.

The field stop ring 140 surrounds the plurality of floating rings 130. The field stop ring 140 includes a continuous doped well surrounding the plurality of floating rings 130. A dopant type of the doped well of the field stop ring 140 is opposite to the dopant type for the plurality of floating rings, the connecting ring 120 and the PIN diodes 115. The field stop ring 140 provide additional protection for reducing expansion of a depletion region to an edge of the PIN diode detector 100. The field stop ring 140 is positioned at a location where the wafer is diced to separate one PIN diode detector 100 from another PIN diode detector 100 formed on a same wafer. In some embodiments, a width D5 of the field stop ring ranges from about 50 µm to about 100 µm. If the width D5 is too small, then a risk of the depletion region spreading to the edge of the PIN diode detector 100 increases, in some instances. If the width D5 is too large, then a size of the PIN diode detector 100 is increased without a noticeable improvement in device performance, in some instances.

While FIG. 1A includes squared corners for each of the connecting ring 120, the plurality of floating rings 130 and the field stop ring 140, one of ordinary skill in the art would recognize that rounded corners are also possible. Further, shapes for the PIN diode detector 100 other than rectangular, such as racetrack shaped, circular, or elliptical, are also within the scope of this disclosure.

Figure 1B:
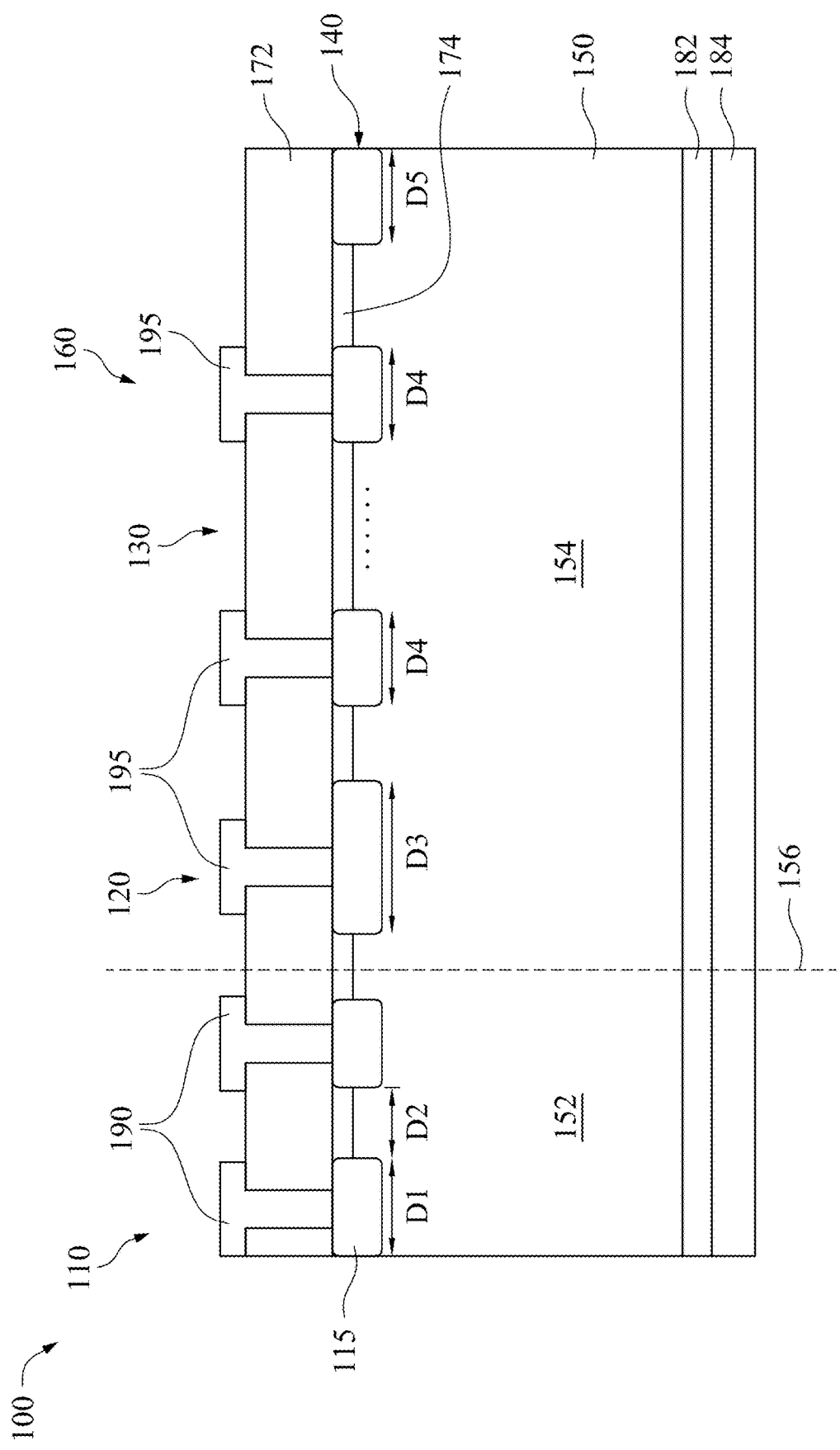
FIG. 1B is a cross-sectional view of the PIN diode detector, in accordance with some embodiments.

FIG. 1B is a cross-sectional view of the PIN diode detector 100, in accordance with some embodiments. The cross-sectional view of FIG. 1B is taken along line A-A of FIG. 1A. Elements in FIG. 1B having a same reference number as in FIG. 1A are the same and redundant description of these elements is avoided for the sake of brevity.

The PIN diode detector 100 includes the pixel region 110 and a peripheral region 160. The peripheral region 160 includes the connecting ring 120, the plurality of floating rings 130 and the field stop ring 140. The PIN diode detector 100 includes a substrate 150. A dopant concentration of the substrate 150 is substantially constant in a thickness direction other than the wells and implant regions described separately. In some embodiments, a resistivity of the substrate 150 ranges from about 5,000 ohm-cm to about 15,000 ohm-cm. If the resistivity of the substrate 150 is too low, then charge carriers are able to travel too freely within the substrate 150 increasing leakage current, in some instances. If the resistivity of the substrate 150 is too high, the charge carriers for the PIN diodes 115 are not able to effectively transfer a charge across the diode, in some instances. The substrate 150 includes a first region 152 in the pixel region 110; and a second region 154 in the peripheral region 160. The first region 152 is separated from the second region 154 at line 156. One of ordinary skill in the art would recognize that line 156 is not a physical element, but merely provided to assist in the understanding of the different regions of the substrate 150.

A dielectric layer 172, such as an inter-layer dielectric (ILD), is over a front surface of the substate 150. The dielectric layer 172 is part of an interconnect structure and is used to provide electrical insulation between conductive components of the interconnect structure. In some embodiments, the dielectric layer 172 includes silicon oxide, silicon nitride, silicon oxynitride, or another suitable dielectric material. In some embodiments, the dielectric layer is formed by chemical vapor deposition (CVD), low pressure CVD (LPCVD), plasma enhanced CVD (PECVD), flowable CVD, or another suitable deposition process.

The PIN diode detector 100 further includes a blanket doped region 174. The blanket doped region 174 extends continuously from the pixel region 110 through an entirety of the peripheral region 160. The blanket doped region 174 has a same dopant type as the field stop ring 140. The blanket doped region 174 helps to minimize expansion of the depletion region from the pixel region 110 into the peripheral region 160. The blanket doped region 174 helps to prevent the depletion region from expanding to the position of the substrate 150 damaged during a dicing process. By helping to avoid the depletion region expanding to the damaged portion of the substrate 150, the charge carriers in the depletion region are maintained separate from the increased number of current pathways and leakage current within the substrate 150 is reduced in comparison with PIN diode detectors that do not include the blanket doped region 174. The reduced current leakage in comparison with other approaches helps to maintain a higher breakdown voltage for the PIN diode detector 100 following dicing in comparison with other approaches that do not include the blanket doped region 174. Further, the blanket doped region 174 has a more uniform distribution of the depletion region in the pixel region 110. The more uniform distribution of the depletion region helps to maintain consistent PIN diode 115 performance across an entirety of the pixel region 110. In PIN diode detectors that do not include the blanket doped region 174, the depletion region would be reduced at edges of the pixel region 110. The reduction at the edges increases a risk of PIN diodes 115 at the edges of the pixel region 110 not properly detecting incident electromagnetic radiation, which would produce black spots in the finally produced image of the detected electromagnetic radiation.

A depth of the blanket doped region 174 is substantially constant along an entirety of the blanket doped region 174. In some embodiments, a depth of the blanket doped region 174 ranges from about 0.5 µm to about 1.5 µm. If a depth of the blanket doped region 174 is too small, then the ability of the blanket doped region 174 to inhibit the depletion region from reaching the damaged portion of the substrate 150 following dicing decreases, in some instances. If the depth of the blanket doped region 174 is too large, then damage to the substrate 150 due to an implantation process being higher increases and forming layers on top of the substrate 150 becomes more difficult, in some embodiments.

A dopant concentration of the blanket doped region 174 is substantially constant along an entirety of the blanket doped region 174. In some embodiments, the dopant concentration of the blanket doped region 174 ranges from $1 \times 10^{14}$ dopants/cm$^3$ to $1 \times 10^{15}$ dopants/cm$^3$. If the dopant concentration is too low, then suppression of the expansion of the depletion region is reduced to an unacceptable level, in some instances. If the dopant concentration is too high, then production costs are increased without a noticeable improvement in device performance, in some instances.

The PIN diode detector 100 further includes a backside doped region 182 on a backside of the substrate from the blanket doped region 174. The backside doped region 182 is capable of operation as an anode and helps to reduce current leakage through the backside of the substrate 150. A dopant type of the backside dope region 182 is a same dopant type as the blanket doped region 174. The backside doped region 182 extends across an entirety of the substrate 150. In some embodiments, a depth of the backside doped region 182 ranges from about 3 µm to about 5 µm. If the depth of the backside doped region 182 is too small, then the backside doped region 182 does not sufficiently limit the current leakage through the backside of the substrate 150, in some instances. If the depth of the backside doped region 182 is too great, then a proximity between the depletion region and the backside doped region 182 is too small and a diode is formed between the two elements, in some embodiments. In some embodiments, the dopant concentration of the backside doped region 182 ranges from $1 \times 10^{18}$ dopants/cm$^3$ to $1 \times 10^{20}$ dopants/cm$^3$. If the dopant concentration is too low, then suppression of the current leakage through the backside of the substrate 150 is insufficient, in some instances. If the dopant concentration is too high, then production costs are increased without a noticeable improvement in device performance, in some instances.

In some embodiments, the PIN diode detector 100 further includes a heat sink 184 on a backside of the substrate 150. The heat sink 184 helps to dissipate heat generated during operation of the PIN diode detector 100. The heat sink 184 includes a thermally conductive material. In some embodiments, the heat sink 184 includes a metal, such as copper or a copper alloy.

The PIN diode detector 100 further includes a first interconnect structure 190. The first interconnect structure 190 provides electrical connection between the PIN diodes 115 and processing circuitry. FIG. 1B includes contact structures as a sample of the first interconnect structure 190. Since the first interconnect structure 190 provides electrical connection between various active components of the PIN diode detector 100, the first interconnect structure 190 is called an active interconnect structure.

The PIN diode detector 100 further includes a second interconnect structure 195. The second interconnect structure 195 is not connected to other circuitry within the PIN diode detector 100. FIG. 1B includes contact structures as a sample of the second interconnect structure 195. Since the second interconnect structure 195 does not provide electrical connection between various active components of the PIN diode detector 100, the second interconnect structure 195 is called a dummy interconnect structure.

Figure 2:
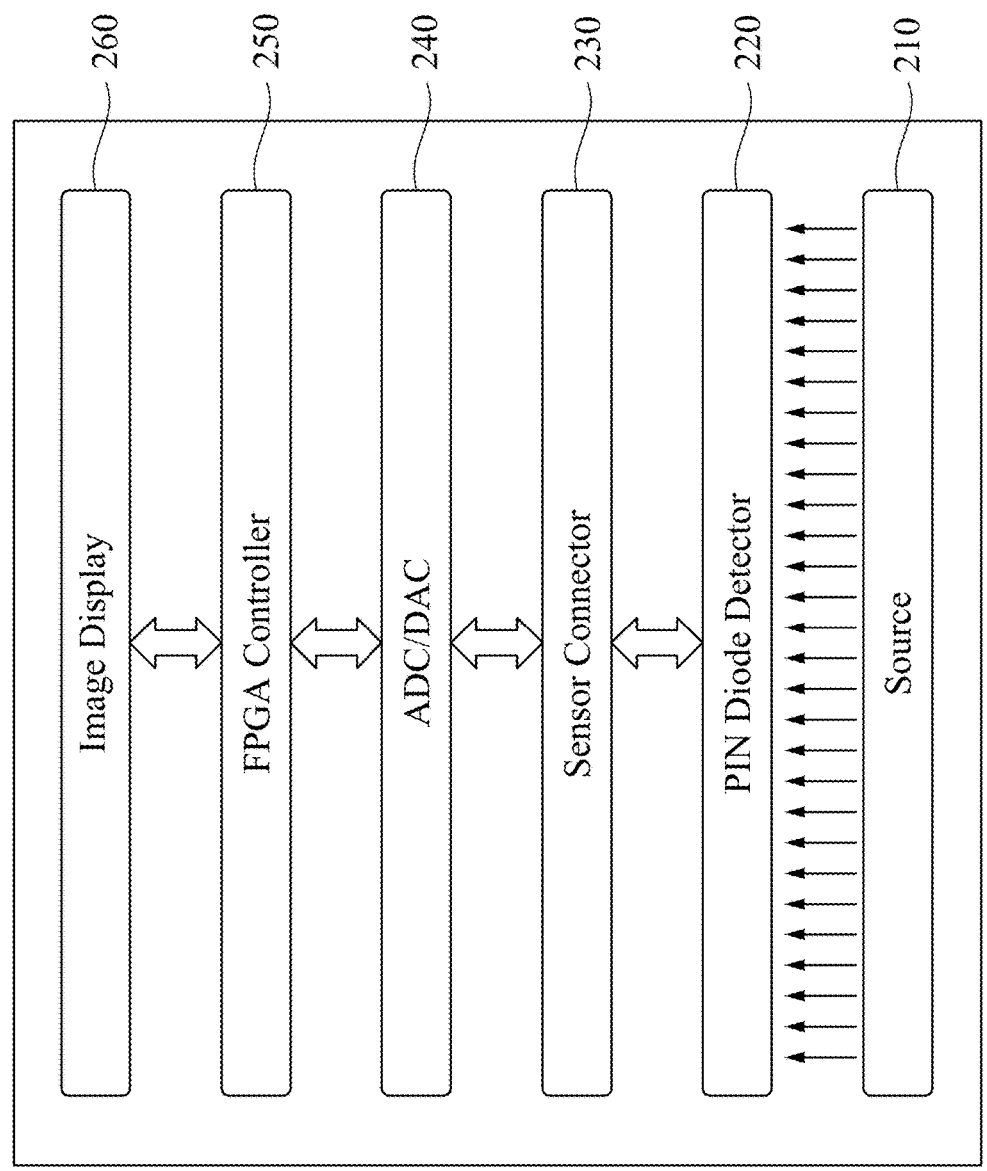
FIG. 2 is a block diagram of a detector system, in accordance with some embodiments.

FIG. 2 is a block diagram of a detector system 200, in accordance with some embodiments. The detector system 200 is configured to receive electromagnetic radiation from a source 210, convert the received electromagnetic radiation into an electrical signal, process the electrical signal and display an image based on the received electromagnetic radiation. In some embodiments, the detector system 200 is part of an integrated system, such as an x-ray diffraction sensor. In some embodiments, the detector system 200 includes an independent image capturing device, such as a camera or other suitable image detector. In some embodiments, the detector system 200 is configured to capture electromagnetic radiation using a PIN diode detector 220 and then transfer the corresponding electrical signals between various components in order to produce an image based on the captured electromagnetic radiation. In some embodiments, the electrical signals are transferred via wired connections. In some embodiments, at least some of the information from electrical signals is transferred wirelessly, such as using Bluetooth™, a local area network (LAN), a telecommunications network, or another suitable wireless communication protocol.

The detector system 200 includes a source 210. The source 210 is configured to emit electromagnetic radiation. In some embodiments, the source 210 is configured to emit x-ray radiation. In some embodiments, the source 210 is configured to emit gamma radiation. In some embodiments, the source 210 is configured to emit other high energy radiation. In some embodiments, an object is between the source 210 and the PIN diode detector 220. When an object is between the source 210 and the PIN diode detector 220, an image of the object is captured and displayed by the detector system 200. In some embodiments, no object is between the source 210 and the PIN diode detector 220. When no object is between the PIN diode detector and the source 210, an image of the emitted electromagnetic radiation from the source is captured and displayed by the detector system 200.

The detector system 200 further includes the PIN diode detector 220. The PIN diode detector 220 is configured to detect electromagnetic radiation of the wavelength emitted by the source 210. In some embodiments, the PIN diode detector 100 (FIGS. 1A and 1B) is usable as the PIN diode detector 220.

The detector system 200 further includes a sensor connector 230 configured to convey an electrical signal from the PIN diode detector 220 to processing circuitry of the detector system 200. In some embodiments, the sensor connector 230 is configured to convey the electrical signal via a wired connection. In some embodiments, the sensor connector 230 is configured to transmit the information from the PIN diode detector 220 wirelessly. In some embodiments, the sensor connector 230 includes a transmitter.

The detector system 200 further includes an analog to digital converter (ADC) and/or a digital to analog converter (DAC), called ADC/DAC 240. The ADC/DAC 240 is usable to convert the electrical signal received from the sensor connector 230 into a format that is usable by the field-programmable gate array (FPGA) controller 250.

The FPGA controller 250 includes an integrated circuit having programmable interconnects usable to implement desired functionality for processing the electrical signals received based on the incident electromagnetic radiation received at the PIN diode detector 220. The FPGA controller 250 is able to help remove noise from the electrical signal in order to provide precise image data for display. In some embodiments, the FPGA controller 250 is also configured to provide additional processing of the image data for identifying target characteristics of the image data.

The detector system 200 further includes an image display 260 configured to display the image data generated by the FPGA controller 250. In some embodiments, the image display 260 includes a monitor, such as a liquid crystal display (LCD), a light emitting diode (LED) display, an organic light emitting diode (OLED) display, or another suitable monitor. In some embodiments, the image display 260 includes a mobile device controllable by a user, such as a smart phone. In some embodiments, the image data received from the FPGA controller 250 is configured to cause the mobile device to generate an alert, such as an audio or visual alert, in response to receipt of the image data. In some embodiments, the mobile device is configured to receive the image data from the FGPA controller 250 wirelessly.

One of ordinary skill in the art would recognize that the example circuitry described above with respect to the detector system 200 is merely exemplary and not limiting to the scope of this description. One of ordinary skill in the art would understand that additional circuitry and processing capabilities, such as neural networks, are usable as part of the detector system 200 in order to help with processing and analysis of the electromagnetic radiation received by the PIN diode detector 220.

Figure 3:
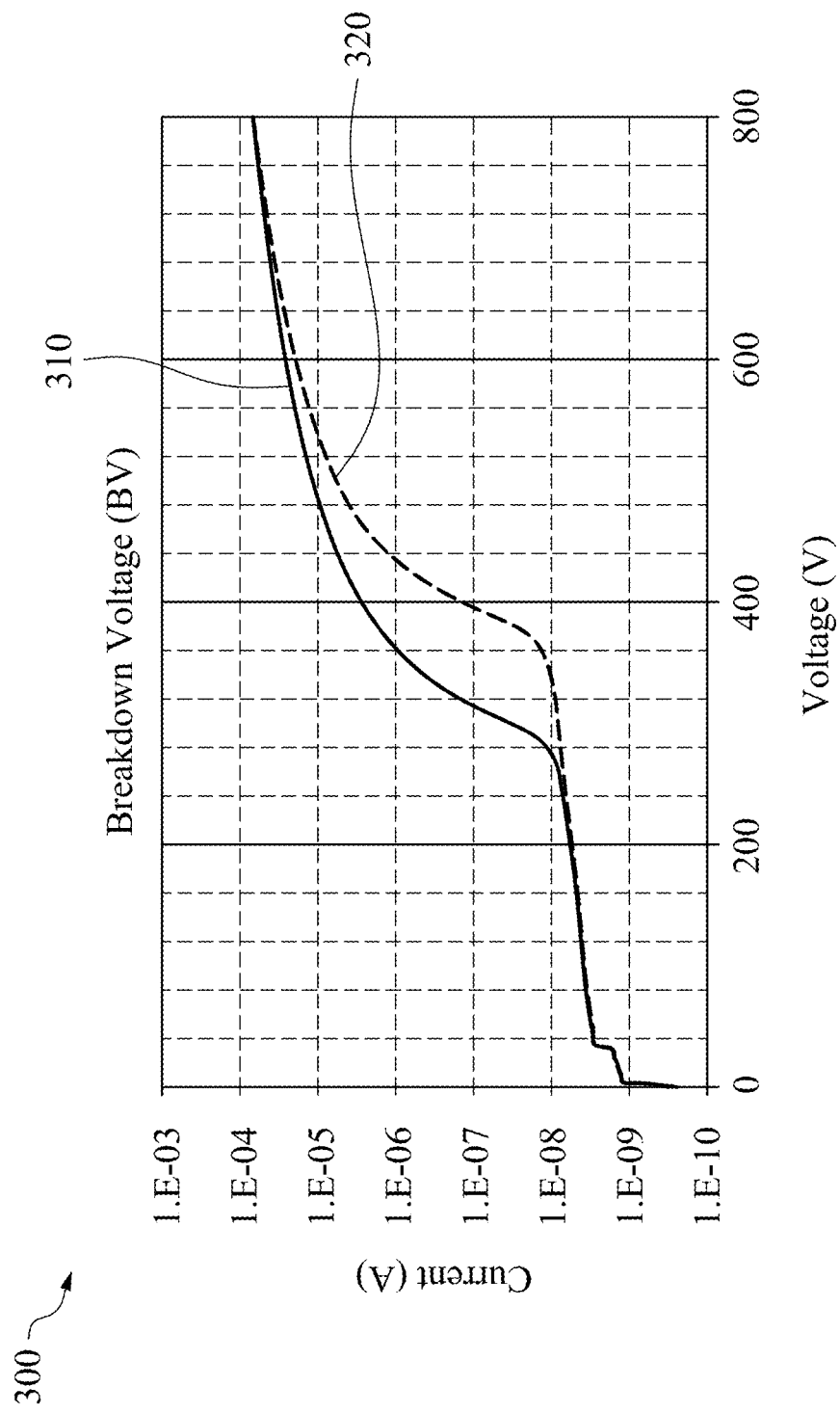
FIG. 3 is a graph of breakdown voltages versus leakage, in accordance with some embodiments.

FIG. 3 is a graph 300 of voltage versus current, in accordance with some embodiments. The graph 300 includes a first plot 310, which indicates performance of a PIN diode detector that does not include a blanket doped region. The graph 300 further includes a second plot 320, which indicates performance of a PIN diode detector that includes a blanket doped region, e.g., PIN diode detector 100 including blanket doped region 174 (FIG. 1B).

A breakdown voltage is a minimum voltage at which an insulator, such as a gate dielectric, becomes electrically conductive. Once a breakdown voltage is reached, a diode, such as a PIN diode, will remain conductive or ON in all conditions. An active device that remains conductive in all conditions does not produce reliable results. In a PIN diode detector, such as PIN diode detector 100 (FIG. 1B) or PIN diode detector 220 (FIG. 2), when a voltage applied to a gate of a PIN diode is equal to or greater than the breakdown voltage, the PIN diode will effectively cease to work as intended and the results from the PIN diode detector are no longer reliable. Breakdown voltage is able to be increased by increasing a size of the insulator; however, such over design techniques increase production costs and increase the size of the PIN diode detector. Over design is able to be reduced or avoided if the reduction of the breakdown voltage is prevented or minimized.

The first plot 310 and the second plot 320 in the graph 300 are generated by applying a reverse voltage to a PIN diode and measuring a current across the device to determine a voltage at which the PIN diode no longer provides resistance to current flow. The first plot 310 and the second plot 320 indicate a breakdown voltage at a point where the current no longer sharply increases as voltage increases, i.e., at an inflection point of the plots. The first plot 310 indicates a breakdown voltage between about 380 volts (V) and about 400 V. The second plot 320 indicates a breakdown voltage between about 440 V and about 460 V.

Figure 4:
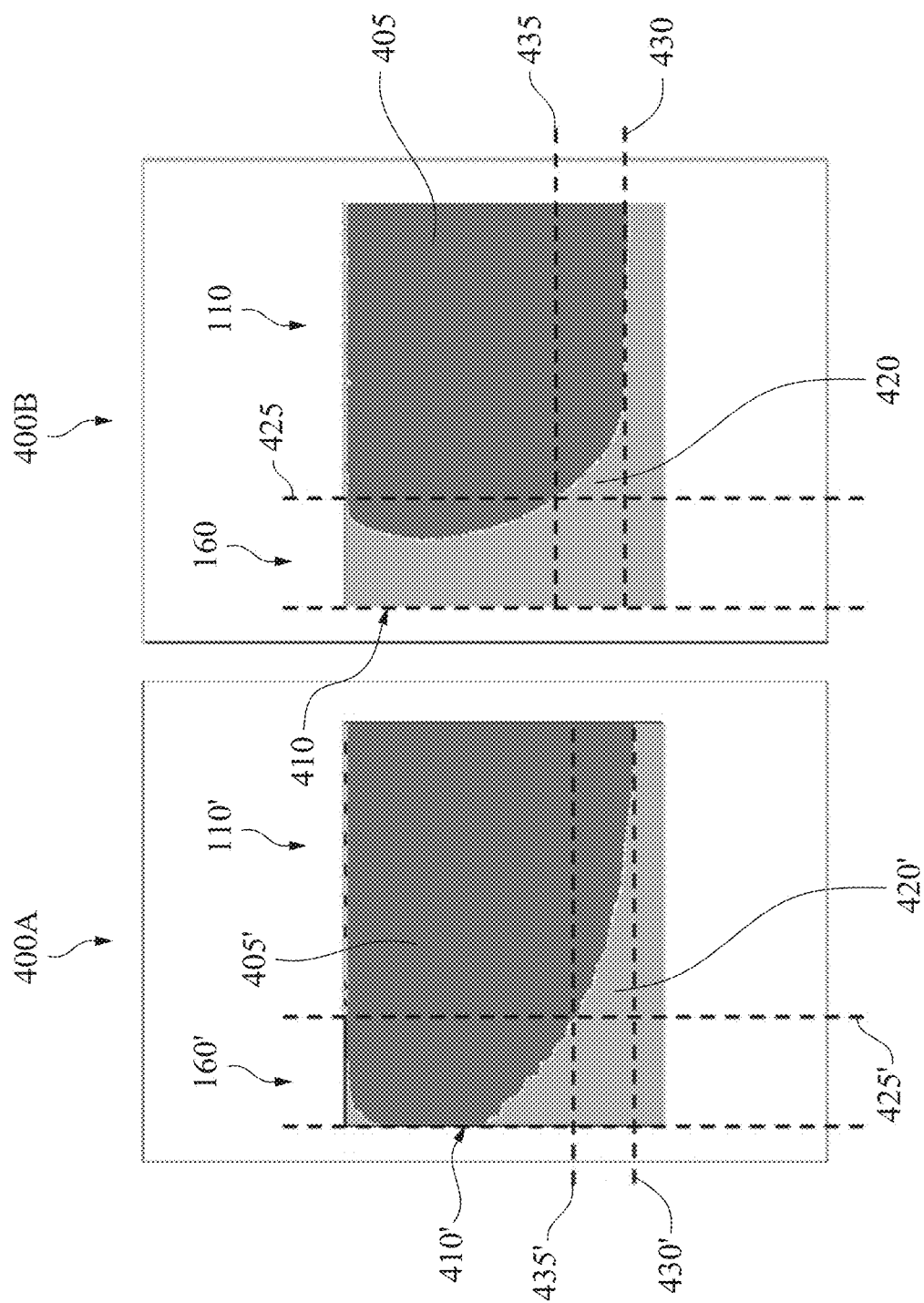
FIG. 4 includes plots of depletion regions within PIN diode detectors, in accordance with some embodiments.

FIG. 4 includes plots 400A and 400B of depletion regions within PIN diode detectors, in accordance with some embodiments. A first plot 400A indicates a depletion region 405' within a PIN diode detector does not include a blanket doped region. The second plot 400B indicates a depletion region 405 within a PIN diode detector includes a blanket doped region, such as PIN diode detector 100 (FIG. 1B) or PIN diode detector 220 (FIG. 2). As discussed above, the location and shape of the depletion region 405 or 405' impacts performance of the corresponding PIN diode detector. As the depletion region approaches a diced edge of the PIN diode detector, charge carriers in the depletion region are able to use the increased number of current pathways created by damage to the crystal structure of the substrate, which increases current leakage and reduces breakdown volage. Further, as a uniformity of the depletion region within a pixel region decreases, precision of performance of different PIN diodes within the PIN diode detector is reduced, e.g., black spots form near edges of the images detected using the pixel region.

For the sake of simplicity, reference numbers from the PIN diode detector 100 (FIG. 1B) are used to indicate locations of some elements within the second plot 400B. Elements having a same functionality in the first plot 400A as corresponding elements in the second plot 400B include a prime (') mark at the end of the reference number. The second plot 400B includes a pixel region 110 and a peripheral region 160. The pixel region 110 is where PIN diodes, e.g., PIN diodes 115 are located which detect incident electromagnetic radiation. The peripheral region 160 is where isolation structures, such as connecting rings, floating rings, field stop rings, or the like are located.

The second plot 400B includes a depletion region 405. The depletion region 405 extends across an entirety of the pixel region 110. The depletion region 405 extends partially across the peripheral region 160. However, the depletion region 405 does not extend across an entirety of the peripheral region 160 and remains separated from a diced edge 410 of the PIN diode detector for the second plot 400B. By maintaining separation from the diced edge 410, charge carriers in the depletion region 405 are not able to access the increased number of current pathways in the damaged regions of the substrate of the PIN diode detector for the second plot 400B. This reduces the current leakage and helps to maintain the breakdown voltage of the PIN diode detector at a value consistent with the breakdown voltage prior to a dicing process.

In comparison, the first plot 400A includes a depletion region 405' and a depletion-free region 420'. The depletion region 405' extends across an entirety of the pixel region 110' and across an entirety of the peripheral region 160'. The depletion region 405' contacts the diced edge 410' of the PIN diode detector for the first plot 400A. Due to the contact between the depletion region 405' and the diced edge 410', the PIN diode detector associated with the first plot 400A will experience an increased current leakage. The increased current leakage will in turn reduce the breakdown voltage of the PIN diode detector associated with the first plot 400A following the dicing process. The depletion region 405' intersects an interface 425' of the pixel region 110' and the peripheral region 160' at a point on the line 435'.

The depletion region 405 includes a bottom surface 430. The bottom surface 430 of the depletion region is substantially uniform across an entirety of the depletion region 405 in the pixel region 110. The depletion region 405 intersects an interface 425 of the pixel region 110 and the peripheral region 160 at a point on line 435. A depletion-free region 420 is defined within the pixel region 110 but outside of the depletion region 405. In the second plot 400B, the depletion free region 420 is limited to a small portion of the pixel region 110 adjacent to the interface 425. The limited extension of the depletion free region 420 in a direction perpendicular to the interface 425 indicates that performance of the PIN diodes within the pixel region 110 is substantially uniform. Also, the substantially planar bottom surface 430 provides additional evidence that the performance of the PIN diodes in the pixel region 110 is substantially uniform.

In comparison, the first plot 400A has a depletion free region 405' that extends a significant distance into the pixel region 110' from the interface 425'. As a result, the performance of the PIN diodes in pixel region 110' is less uniform than the performance of the PIN diodes in pixel region 110. Further, the lack of a planar bottom surface 430' for the depletion region 405' is further evidence of reduced uniformity for the performance of the PIN diodes in the pixel region 110'. This reduced performance uniformity produces, in some instances, lower resolution at an edge of the pixel region 110', the formation of black spots near the edge of the pixel region 110', or other similar performance reductions.

Based on differences between the first plot 400A and the second plot 400B, one of ordinary skill in the art would recognize the impact in performance inclusion of a blanket doped region, e.g., the blanket doped region 174 (FIG. 1B), has on performance of a PIN diode detector.

Figure 5:
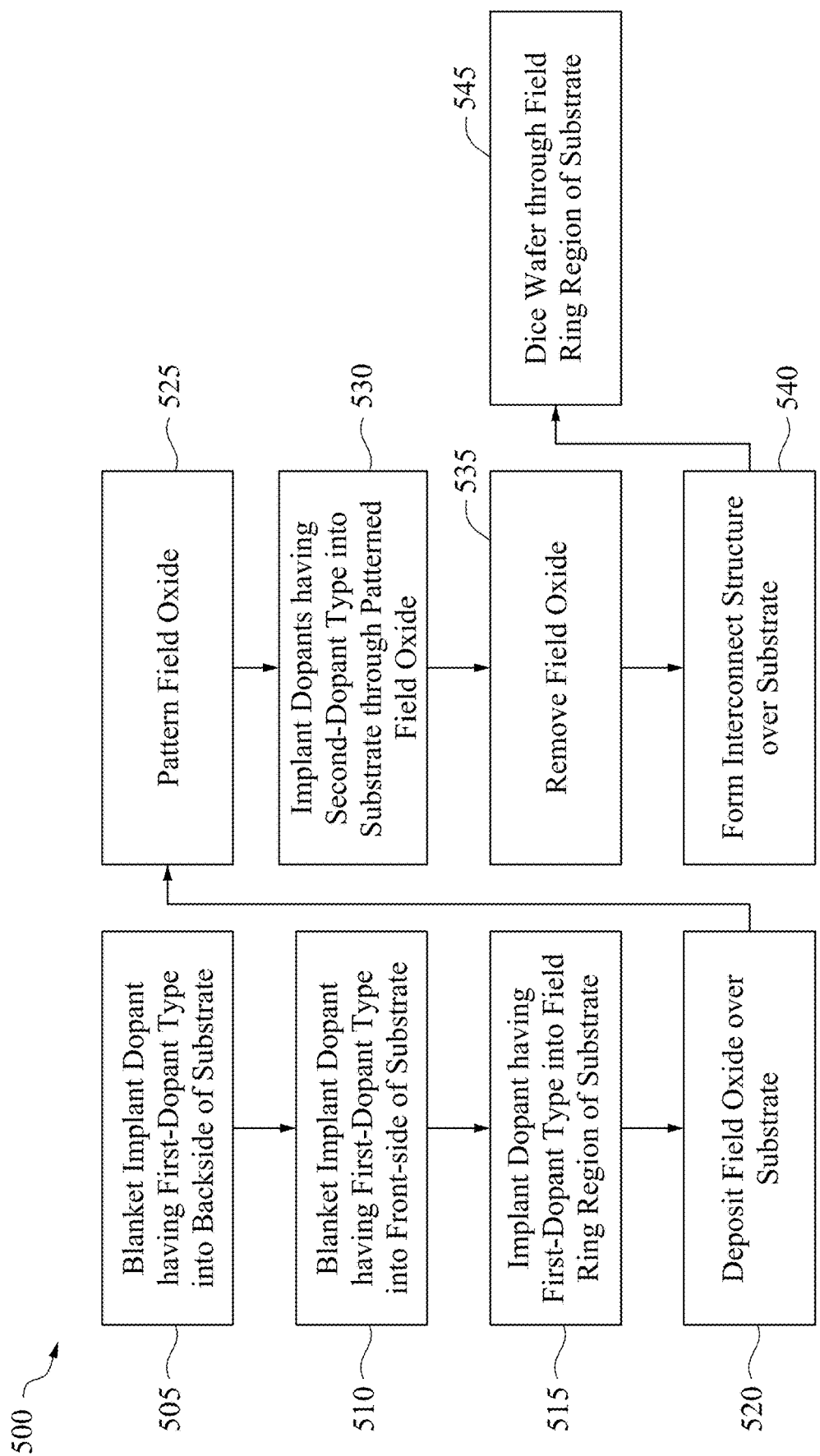
FIG. 5 is a flowchart of a method of making a PIN diode detector, in accordance with some embodiments.

FIG. 5 is a flowchart of a method 500 of making a PIN diode detector, in accordance with some embodiments. The method 500 is usable to manufacturing a PIN diode detector, such as PIN diode detector 100 (FIGS. 1A and 1B) or PIN diode detector 220 (FIG. 2).

In operation 505, a blanket implantation process is performed on a backside of a substrate using a dopant having a first dopant type. The blanket implantation process means that the implantation process is substantially uniform across an entirety of the substrate. In some embodiments, the blanket implantation is performed using an ion implantation process. In some embodiments, the blanket implantation process includes implanting an n-type dopant. In some embodiments, a depth of the implantation process is about 3 µm to about 5 µm. If the depth of the implantation process is too small, then the resulting implant layer will be incapable of reducing backside current leakage or functioning as an anode, in some instances. If the depth of the implantation process is too great, then a conductive path between a depletion region to be defined in the PIN diode detector and the resulting implant layer will negatively impact performance of the PIN diode detector, in some instances. In some embodiments, the blanket implantation process is performed through a pad oxide layer in order to minimize damage to the substrate during the implantation process. In some embodiments, a dosage of the implantation process ranges from about $1 \times 10^{13}$ dopants/cm$^2$ to about $1 \times 10^{14}$ dopant/cm$^2$. If the dosage is too high, then a resulting concentration of the implant region is increased and a risk of a conductive path forming between the implant region and the depletion region increases, in some instances. If the dosage is too low, then a risk of the implant region begin unable to function as an anode or reducing backside current leakage increases, in some instances. In some embodiments, an implantation energy of the blanket implantation process ranges from about 50 kilo electron volts (keV) to about 100 keV. The implantation energy is related to a depth of the implantation region and would have a similar impact on the performance of the PIN diode detector. As implantation energy increases, the depth of the implanted region increases. In some embodiments, the operation 505 produces the backside doped region 182 (FIG. 1B).

Figure 6A:
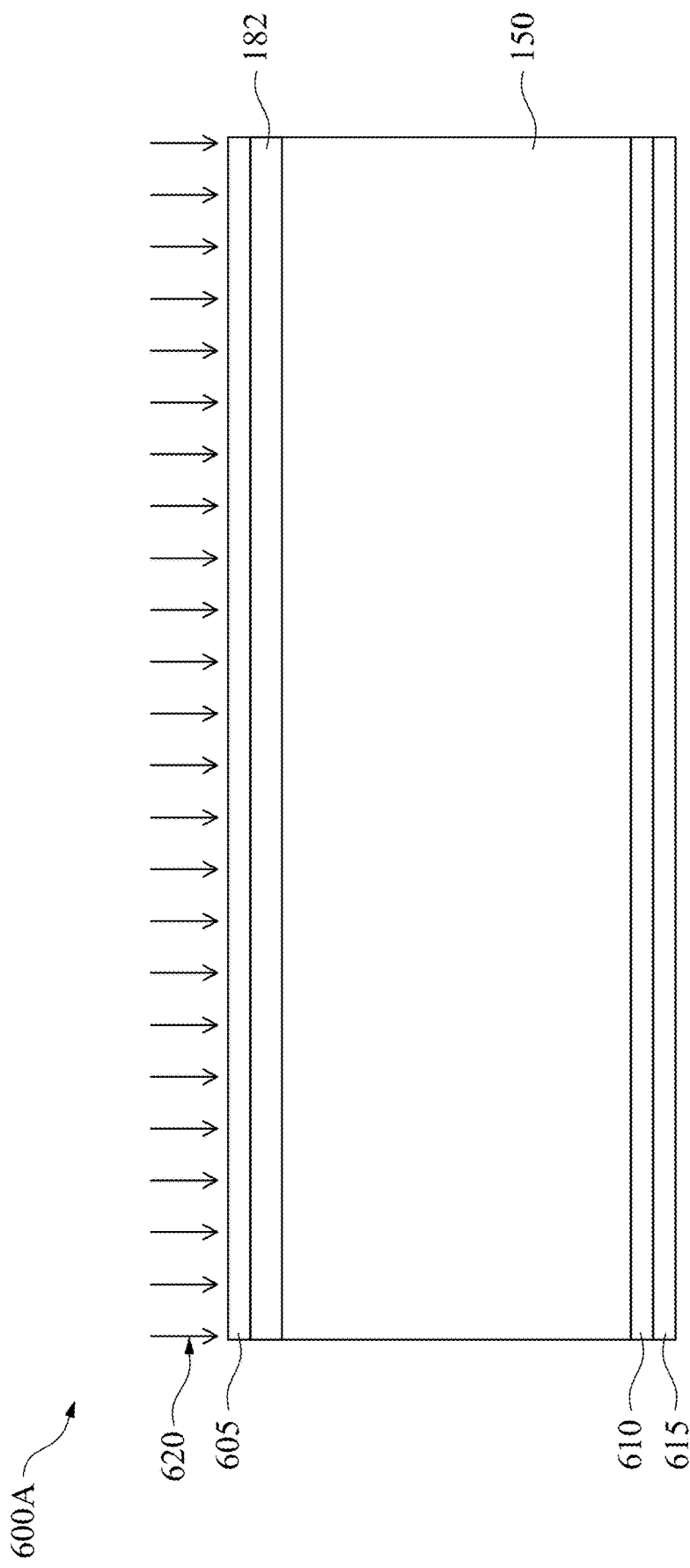
FIGS. 6A-6F are cross-sectional views of a PIN diode detector during various stages of manufacture, in accordance with some embodiments.

FIG. 6A is a cross-sectional view of a PIN diode detector 600A during an intermediate stage of manufacture, in accordance with some embodiments. In some embodiments, the PIN diode detector 600A is a structure produced by operation 505 (FIG. 5). The PIN diode detector 600A includes a substrate 150. A first pad oxide layer 605 is over a backside of the substrate 150. In some embodiments, the first pad oxide layer 605 is formed by thermal oxidation of the substrate 150. In some embodiments, the first pad oxide layer 605 is formed by CVD, PECVD, LPCVD, or another suitable deposition process. A second pad oxide layer 610 is on a front-side surface of the substrate 150. In some embodiments, the second pad oxide layer 610 is formed by thermal oxidation of the substrate 150. In some embodiments, the second pad oxide layer 610 is formed by CVD, PECVD, LPCVD, or another suitable deposition process. In some embodiments, the first pad oxide layer 605 is formed simultaneously with the formation of the second pad oxide layer 610. In some embodiments, the first pad oxide layer 605 is formed before or after formation of the second pad oxide layer 610. A dielectric layer 615 is on the second pad oxide layer 610. In some embodiments, the dielectric layer 615 includes silicon nitride.

A blanket implantation process 620, such as the blanket implantation process described with respect to operation 505 (FIG. 5), is performed on the backside of the substrate 150. The implantation process implants dopants through the first pad oxide layer 605 in order to produce backside doped region 182. The blanket implantation process 620 is substantially uniform across the substrate 150.

Returning to FIG. 5, in operation 510, a blanket implantation process is performed to implant dopants having the first dopant type into the front-side of the substrate. The blanket implantation process means that the implantation process is substantially uniform across an entirety of the substrate. In some embodiments, the blanket implantation is performed using an ion implantation process. In some embodiments, the blanket implantation process includes implanting an n-type dopant. In some embodiments, a depth of the implantation process is about 0.5 µm to about 1.5 µm. If the depth of the implantation process is too small, then the resulting implant layer will be incapable of preventing the depletion region from extending to a diced edge of the PIN diode detector, in some instances. If the depth of the implantation process is too great, then damage to the substrate 150 due to an implantation process being higher increases and forming layers on top of the substrate 150 becomes more difficult, in some instances. In some embodiments, the blanket implantation process is performed through a pad oxide layer in order to minimize damage to the substrate during the implantation process. In some embodiments, a dosage of the implantation process ranges from about $1 \times 10^{11}$ dopants/cm$^2$ to about $5 \times 10^{11}$ dopant/cm$^2$. If the dosage is too high, then a resulting concentration of the implant region is increased and a risk of a conductive path forming between the implant region and the depletion region increases, in some instances. If the dosage is too low, then a risk of the implant region failing to inhibit the depletion region from extending to the damaged edge of the substrate increases, in some instances. In some embodiments, an implantation energy of the blanket implantation process ranges from about 20 keV to about 50 keV. The implantation energy is related to a depth of the implantation region and would have a similar impact on the performance of the PIN diode detector. As implantation energy increases, the depth of the implanted region increases. In some embodiments, the operation 510 produces the blanket doped region 174 (FIG. 1B).

Figure 6B:
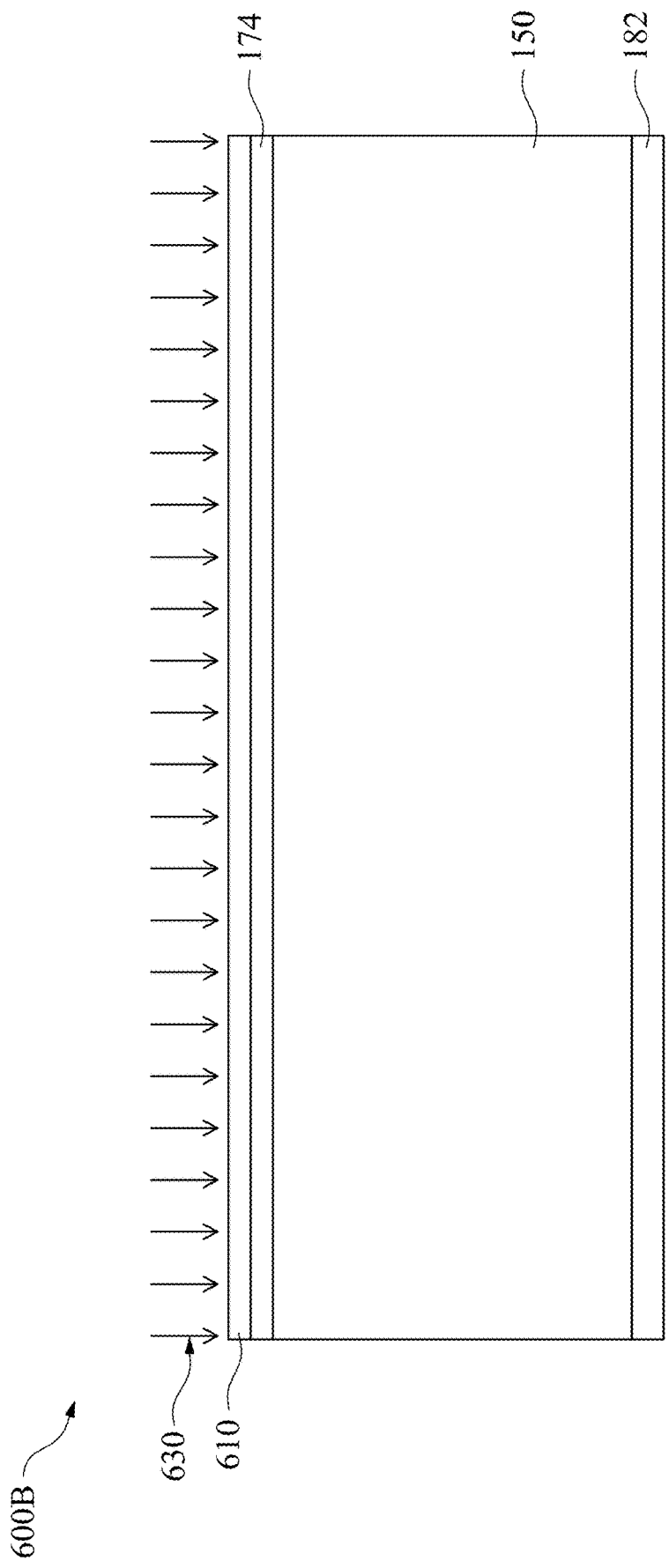

FIG. 6B is a cross-sectional view of a PIN diode detector 600B during an intermediate stage of manufacture, in accordance with some embodiments. In some embodiments, the PIN diode detector 600B is a structure produced by operation 510 (FIG. 5). In comparison with the PIN diode detector 600A, the dielectric layer 615 and the first pad oxide layer 605 have been removed from the PIN diode detector 600B. In some embodiments, at least one of the dielectric layer 615 or the first pad oxide layer 605 were removed using a planarization process, such as chemical mechanical planarization (CMP) or grinding. In some embodiments, at least one of the dielectric layer 615 or the first pad oxide layer 605 were removed using an etching process, or another suitable material removal process. A blanket implantation process 630, such as the blanket implantation process described with respect to operation 510 (FIG. 5), is performed on the front-side of the substrate 150. The implantation process implants dopants through the second pad oxide layer 610 in order to produce blanket doped region 174. The blanket implantation process 630 is substantially uniform across the substrate 150.

Returning to FIG. 5, in operation 515, a dopant having the first dopant type is implanted into the substrate to form a field ring. A photoresist is formed over the first front-side of the substrate and patterned in order to define a location of the implantation to form the field ring. In some embodiments, the implantation is performed using an ion implantation process. In some embodiments, the implantation process includes implanting an n-type dopant. In some embodiments, a depth of the implantation process is about 3 μm to about 5 μm. If the depth of the implantation process is too small, then the resulting well will be incapable of helping to prevent the depletion region from extending to a diced edge of the PIN diode detector, in some instances. If the depth of the implantation process is too great, then a risk of the resulting well forming a conductive path with the depletion region increases, in some instances. In some embodiments, the implantation process is performed through a pad oxide layer in order to minimize damage to the substrate during the implantation process. In some embodiments, a dosage of the implantation process ranges from about $1 \times 10^{12}$ dopants/cm$^2$ to about $1 \times 10^{14}$ dopant/cm$^2$. If the dosage is too high, then a resulting concentration of the implant region is increased and a risk of a conductive path forming between the resulting well and the depletion region increases, in some instances. If the dosage is too low, then a risk of the resulting well failing to inhibit the depletion region from extending to the damaged edge of the substrate increases, in some instances. In some embodiments, an implantation energy of the blanket implantation process ranges from about 30 keV to about 80 keV. The implantation energy is related to a depth of the resulting well and would have a similar impact on the performance of the PIN diode detector. As implantation energy increases, the depth of the resulting well increases. In some embodiments, the operation 515 produces the field stop ring 140 (FIG. 1B).

Figure 6C:
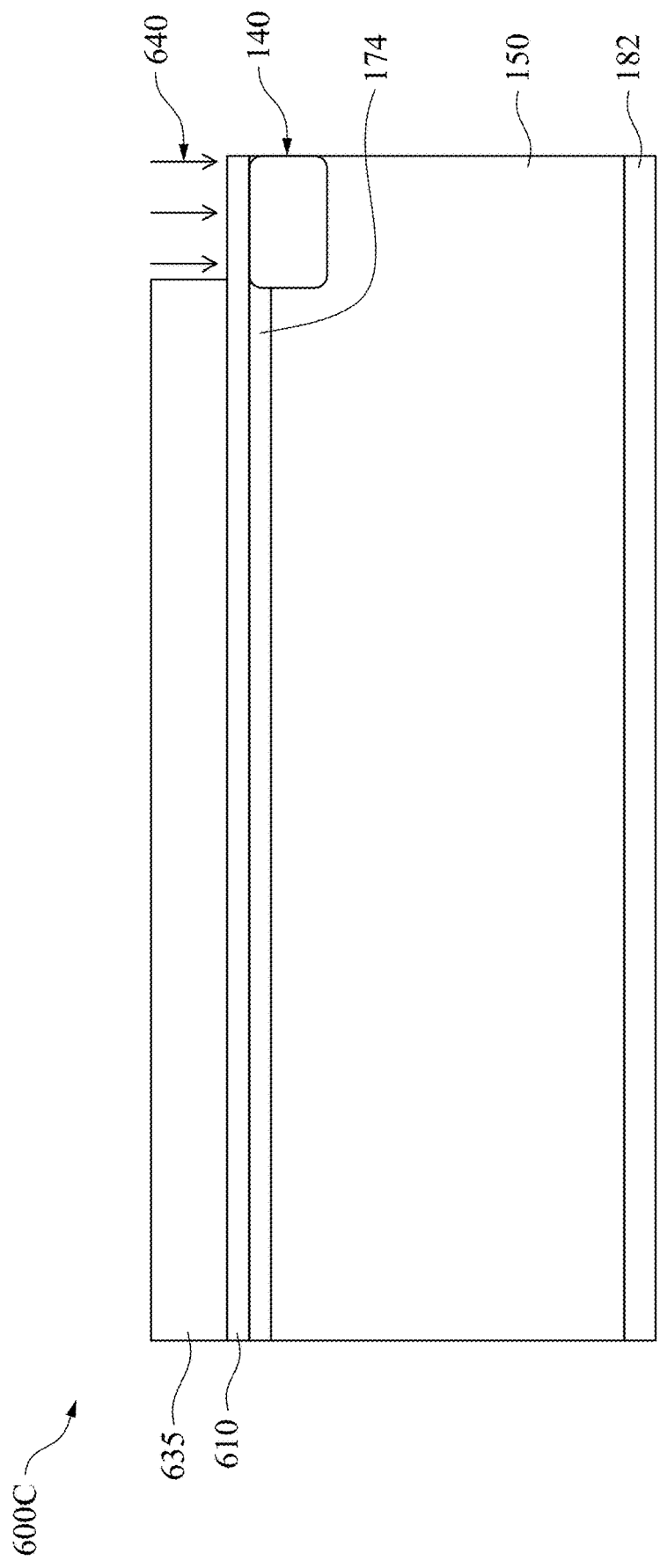

FIG. 6C is a cross-sectional view of a PIN diode detector 600C during an intermediate stage of manufacture, in accordance with some embodiments. In some embodiments, the PIN diode detector 600C is a structure produced by operation 515 (FIG. 5). In comparison with the PIN diode detector 600B, a photoresist 635 has been deposited and patterned for the PIN diode detector 600C. In some embodiments, the photoresist was deposited by spin-on coating, flowable CVD, or another suitable deposition process. In some embodiments, the photoresist was patterned using a lithographic process or another suitable patterning process. An implantation process 640, such as the implantation process described with respect to operation 515 (FIG. 5), is performed on the front-side of the substrate 150. The implantation process 640 implants dopants through the second pad oxide layer 610 in order to produce field stop ring 140. The implantation process 640 is limited to the portion of the substrate 150 exposed by the patterned photoresist 635.

Returning to FIG. 5, in operation 520 a field oxide is deposited over the substrate in order to protect the substrate during subsequent implantation processes. In some embodiments, the field oxide includes silicon oxide, silicon oxynitride or another suitable dielectric material. In some embodiments, the field oxide is deposited using CVD, LPCVD, PECVD, or another suitable deposition process.

Figure 6D:
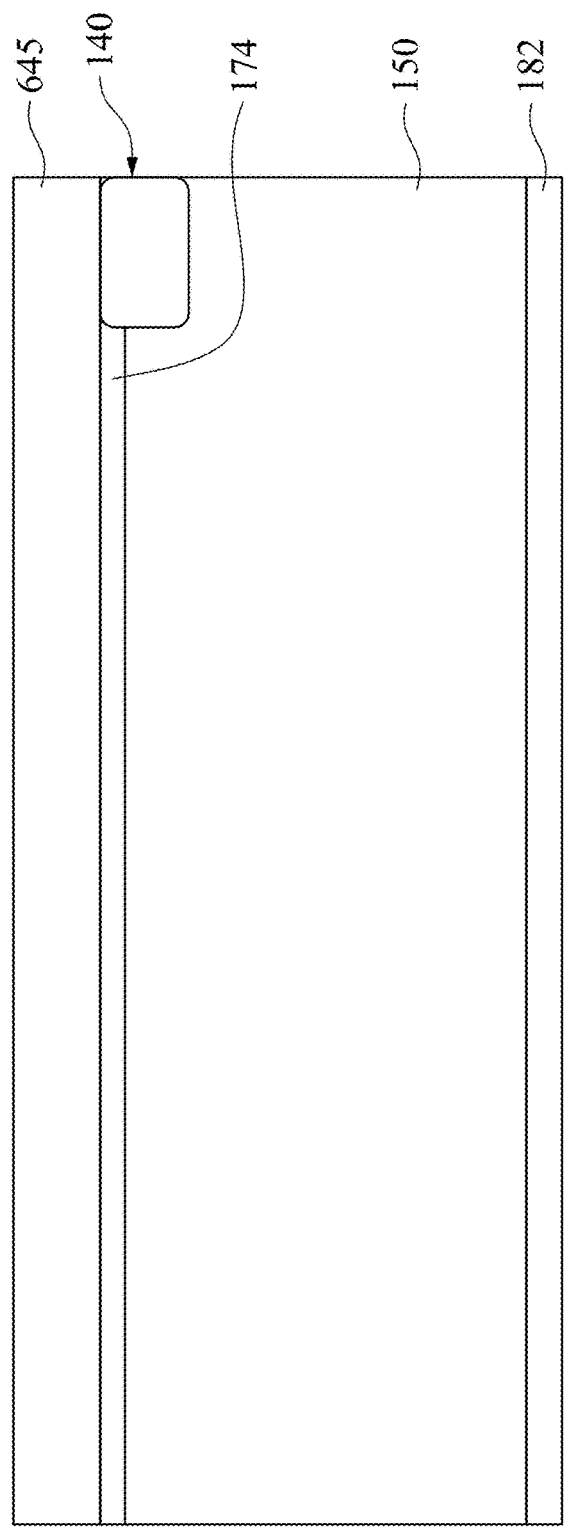

FIG. 6D is a cross-sectional view of a PIN diode detector 600D during an intermediate stage of manufacture, in accordance with some embodiments. In some embodiments, the PIN diode detector 600D is a structure produced by operation 520 (FIG. 5). In comparison with the PIN diode detector 600C, the photoresist 635 has been removed from the PIN diode detector 600D. In some embodiments, the photoresist was removed using ashing or another suitable removal process. A field oxide 645 is formed over the front-side of the substrate 150 to protect the blanket doped region 174 and the field stop ring 140 during subsequent processing.

Returning to FIG. 5, in operation 525, the field oxide is patterned. In some embodiments, the field oxide is patterned using a photoresist and a lithographic process. The patterned field oxide is usable as a hard mask for subsequent implantation processes. In some embodiments, the photoresist used for patterning the hard mask is removed following patterning of the field oxide. In some embodiments, the photoresist is removed simultaneously with the patterning of the field oxide. In some embodiments, at least a portion of the photoresist remains on the field oxide during a later implantation process.

In operation 530, a dopant having a second dopant type is implanted into the substrate through the patterned field oxide. In some embodiments, the implantation is performed using an ion implantation process. In some embodiments, the implantation process includes implanting a p-type dopant. In some embodiments, a depth of the implantation process is about 3 μm to about 5 μm. If the depth of the implantation process is too small, then the resulting wells in a peripheral region will be incapable of helping to prevent the depletion region from extending to a diced edge of the PIN diode detector, in some instances. If the depth of the implantation process is too great, then production cost is increased without a noticeable improvement in device performance, in some instances. In some embodiments, a dosage of the implantation process ranges from about $1 \times 10^{12}$ dopants/cm$^2$ to about $1 \times 10^{14}$ dopant/cm$^2$. If the dosage is too high, then production cost is increased without a noticeable improvement in device performance, in some instances. If the dosage is too low, then a risk of the resulting wells in the peripheral region failing to inhibit the depletion region from extending to the damaged edge of the substrate increases, in some instances. In some embodiments, an implantation energy of the blanket implantation process ranges from about 30 keV to about 80 keV. The implantation energy is related to a depth of the resulting well and would have a similar impact on the performance of the PIN diode detector. As implantation energy increases, the depth of the resulting well increases. In some embodiments, the operation 530 produces the plurality of floating rings 130, the connecting ring 120, and the PIN diodes 115 (FIG. 1B).

Figure 6E:
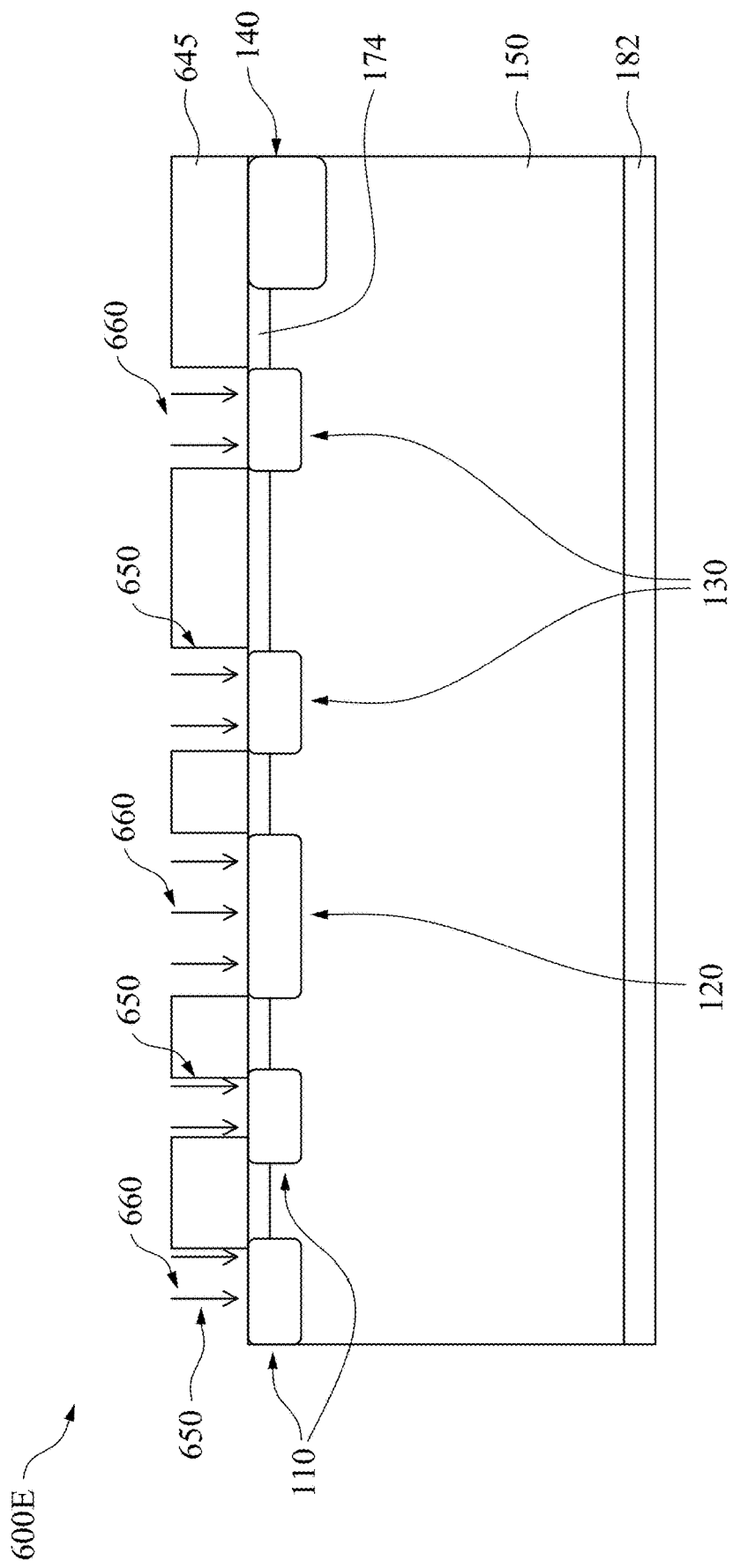

FIG. 6E is a cross-sectional view of a PIN diode detector 600E during an intermediate stage of manufacture, in accordance with some embodiments. In some embodiments, the PIN diode detector 600E is a structure produced by operation 530 (FIG. 5). In comparison with the PIN diode detector 600D, the field oxide 645 has been patterned to define openings 650 in the field oxide 645 of in the PIN diode detector 600D. In some embodiments, field oxide 645 was patterned using a photoresist and a lithographic process. An implantation process 660 is performed on the substrate 150 through the openings 650 to implant dopants into the substrate. The implantation process 660 implants dopants through the openings 650 in order to produce PIN diodes 115, the connecting ring 120 and the plurality of floating rings 130 (FIG. 1B). The implantation process 660 is limited to the portion of the substrate 150 exposed by the openings 650. In some embodiments, the implantation process 660 includes a single process for forming each of the PIN diodes 115, the connecting ring 120 and the plurality of floating rings 130. In some embodiments, a separate implantation process 660 is used to form at least one of the PIN diodes 115, the connecting ring 120 or the plurality of floating rings 130 than used to form another of the PIN diodes 115, the connecting ring 120 or at least one of the floating rings 130.

Returning to FIG. 5, in operation 535, the field oxide is removed. Removing the field oxide exposes a top surface of the substrate that is doped with the various rings and blanket doped region. In some embodiments, the field oxide is removed using a planarization process, such as CMP, grinding or another suitable removal process. In some embodiments, the field oxide is removed using an etching process.

In operation 540, an interconnect structure is formed over the substrate. Forming the interconnect structure includes forming an active interconnect structure over PIN diodes, e.g., PIN diodes 115 (FIG. 1B), of the PIN diode detector. In some embodiments, forming the interconnect structure includes forming a dummy interconnect structure electrically connected to wells in the peripheral region of the PIN diode detector. Forming an interconnect structure includes forming dielectric layers; forming openings in the dielectric layers; and forming conductive elements within the openings. In some embodiments, the dielectric layers include silicon oxide, silicon nitride, silicon oxynitride or another suitable dielectric material. In some embodiments, the dielectric layers are formed using CVD, LPCVD, PECVD, or another suitable deposition process. In some embodiments, the openings are formed using a lithographic process or another suitable patterning process. In some embodiments, the conductive material includes, copper, aluminum, tungsten, cobalt, alloys, or other suitable conductive material. In some embodiments, forming the conductive material includes plating, physical vapor deposition (PVD), CVD, or another suitable deposition process.

In operation 545, a wafer is diced through the field stop ring of the substrate in order to separate the PIN diode detector from other PIN diode detectors formed on a same wafer. In some embodiments, the wafer is diced using a saw. In some embodiments, the wafer is diced using a laser. In some embodiments, the wafer is diced using an etching process.

Figure 6F:
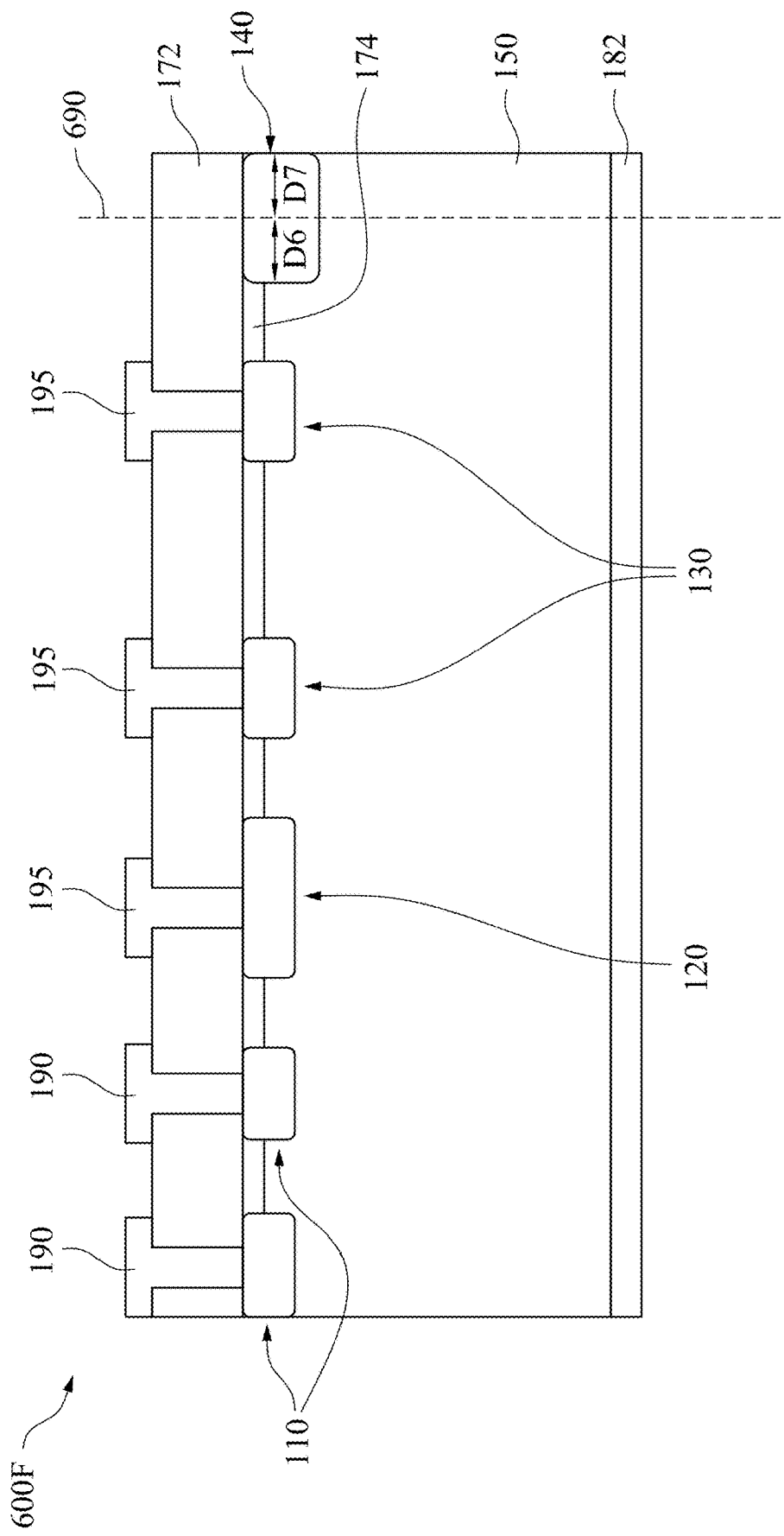

FIG. 6F is a cross-sectional view of a PIN diode detector 600F during an intermediate stage of manufacture, in accordance with some embodiments. In some embodiments, the PIN diode detector 600F corresponds to a PIN diode detector during operation 545 (FIG. 5). In comparison with PIN diode detector 600E, the PIN diode detector 600E includes an ILD 172 over the substrate 150. The PIN diode detector 600E further includes active interconnect structure 190 electrically connected to PIN diodes 115. The PIN diode detector 600E further includes dummy interconnect structure 195 in the peripheral region 160 electrically connected to the connecting ring 120 and the plurality of floating rings 130.

The PIN diode detector 600E includes a dicing line 690 along which the PIN diode detector 600E is diced to be separated from other PIN diode detectors on the wafer. The dicing line 690 extends through the field stop ring 140. A dimension D6 of the field stop ring 140 will remain as part of the PIN diode detector 600E following the dicing process. A dimension D7 of the field stop ring 140 will be removed from the PIN diode detector 600E by the dicing process. In some embodiments, D6 is equal to D7, i.e., the field stop ring 140 is cut in the middle. In some embodiments, D6 is less than D7. In some embodiments, D6 is greater than D7.

One of ordinary skill in the art would understand that method 500 is not limited to the operations and sequence of operations described above. In some embodiments, at least one additional operation is included in method 500. For example, in some embodiments, the method further includes formation of gate structures for controlling the PIN diodes 115. In some embodiments, at least one operation is omitted from method 500. For example, in some embodiments, the field oxide is omitted and the implantation processes of operation 530 is controlled to only contact the substrate at select locations using a pre-fabricated mask. In some embodiments, an order of operations of the method 500 is modified. For example, in some embodiments, operation 510 is performed prior to operation 505. In some embodiments, at least one operation is modified. For example, in some embodiments, instead of an implantation process in operation 510, a layer of doped material is deposited on the substrate and then dopants are driven into the substrate using an annealing process. In some embodiments, a duration of the annealing process is controlled to minimize damage that would negatively impact a photocurrent performance for PIN diodes 115.

Figure 7:
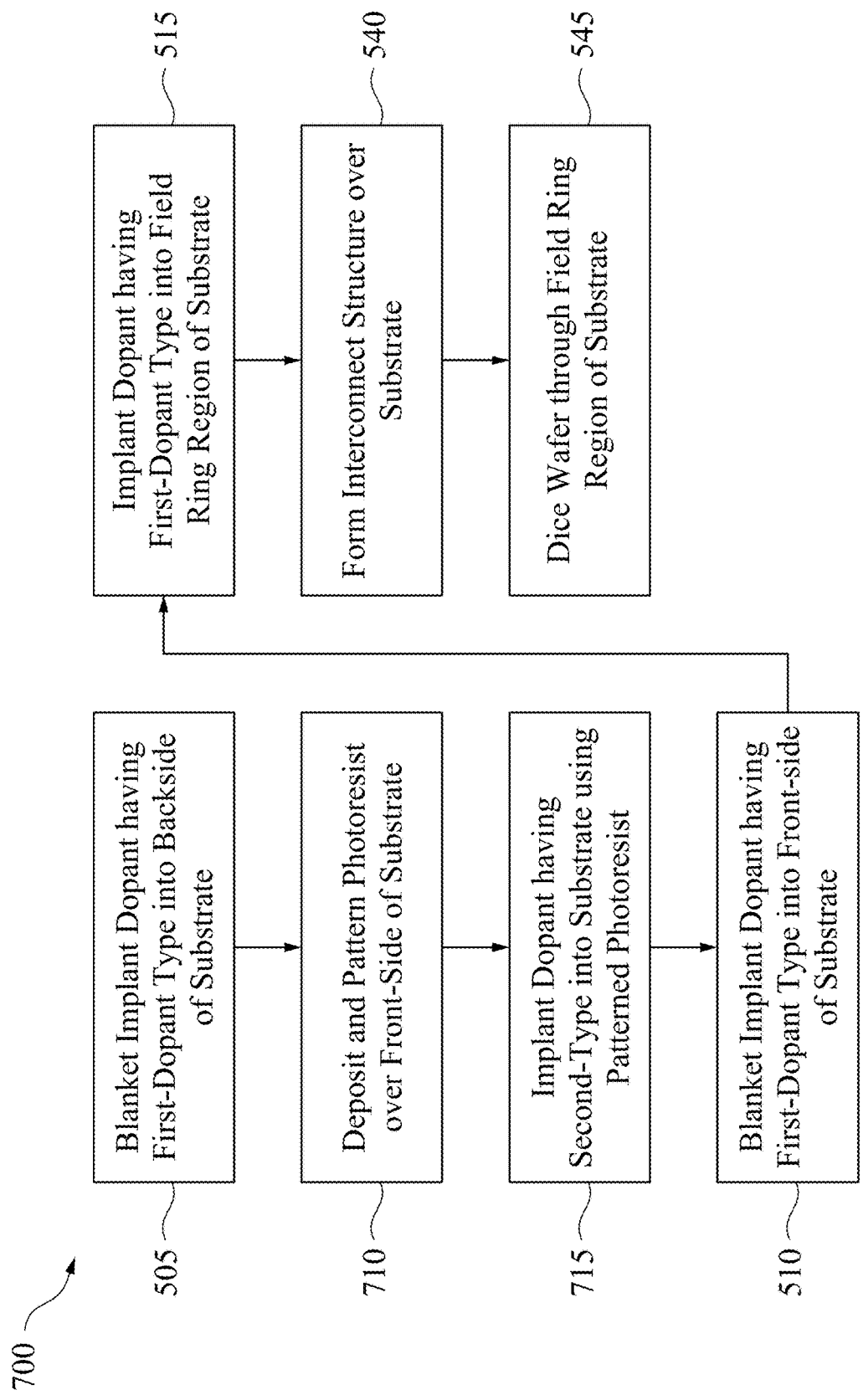
FIG. 7 is a flowchart of a method of making a PIN diode detector, in accordance with some embodiments.

FIG. 7 is a flowchart of a method of making a PIN diode detector, in accordance with some embodiments. The method 700 is usable to manufacturing a PIN diode detector, such as PIN diode detector 100 (FIGS. 1A and 1B) or PIN diode detector 220 (FIG. 2). Some of the operation of the method 700 are the same as operations in method 500 (FIG. 5). Descriptions of operations shared between the methods are abbreviated for the sake of brevity.

In operation 505, a blanket implantation process is performed on a backside of a substrate using a dopant having a first dopant type. The blanket implantation process means that the implantation process is substantially uniform across an entirety of the substrate. In some embodiments, the blanket implantation is performed using an ion implantation process. In some embodiments, the blanket implantation process includes implanting an n-type dopant.

In operation 710, a photoresist is deposited over the substrate and patterned to define a plurality of openings. In some embodiments, the photoresist is formed by spin-on coating or another suitable deposition process. In some embodiments, the photoresist is patterned using a photoresist and a lithographic process. The patterned photoresist is usable as a mask for subsequent implantation processes.

In operation 715, a dopant having a second dopant type is implanted into the substrate through the patterned photoresist. In some embodiments, the implantation is performed using an ion implantation process. In some embodiments, the implantation process includes implanting a p-type dopant. In some embodiments, a depth of the implantation process is about 3 μm to about 5 μm. If the depth of the implantation process is too small, then the resulting wells in a peripheral region will be incapable of helping to prevent the depletion region from extending to a diced edge of the PIN diode detector, in some instances. If the depth of the implantation process is too great, then production cost is increased without a noticeable improvement in device performance, in some instances. In some embodiments, a dosage of the implantation process ranges from about $1\times10^{12}$ dopants/cm$^2$ to about $1\times10^{14}$ dopant/cm$^2$. If the dosage is too high, then production cost is increased without a noticeable improvement in device performance, in some instances. If the dosage is too low, then a risk of the resulting wells in the peripheral region failing to inhibit the depletion region from extending to the damaged edge of the substrate increases, in some instances. In some embodiments, an implantation energy of the blanket implantation process ranges from about 30 keV to about 80 keV. The implantation energy is related to a depth of the resulting well and would have a similar impact on the performance of the PIN diode detector. As implantation energy increases, the depth of the resulting well increases. In some embodiments, the operation 530 produces the plurality of floating rings 130, the connecting ring 120, and the PIN diodes 115 (FIG. 1B).

Figure 8A:
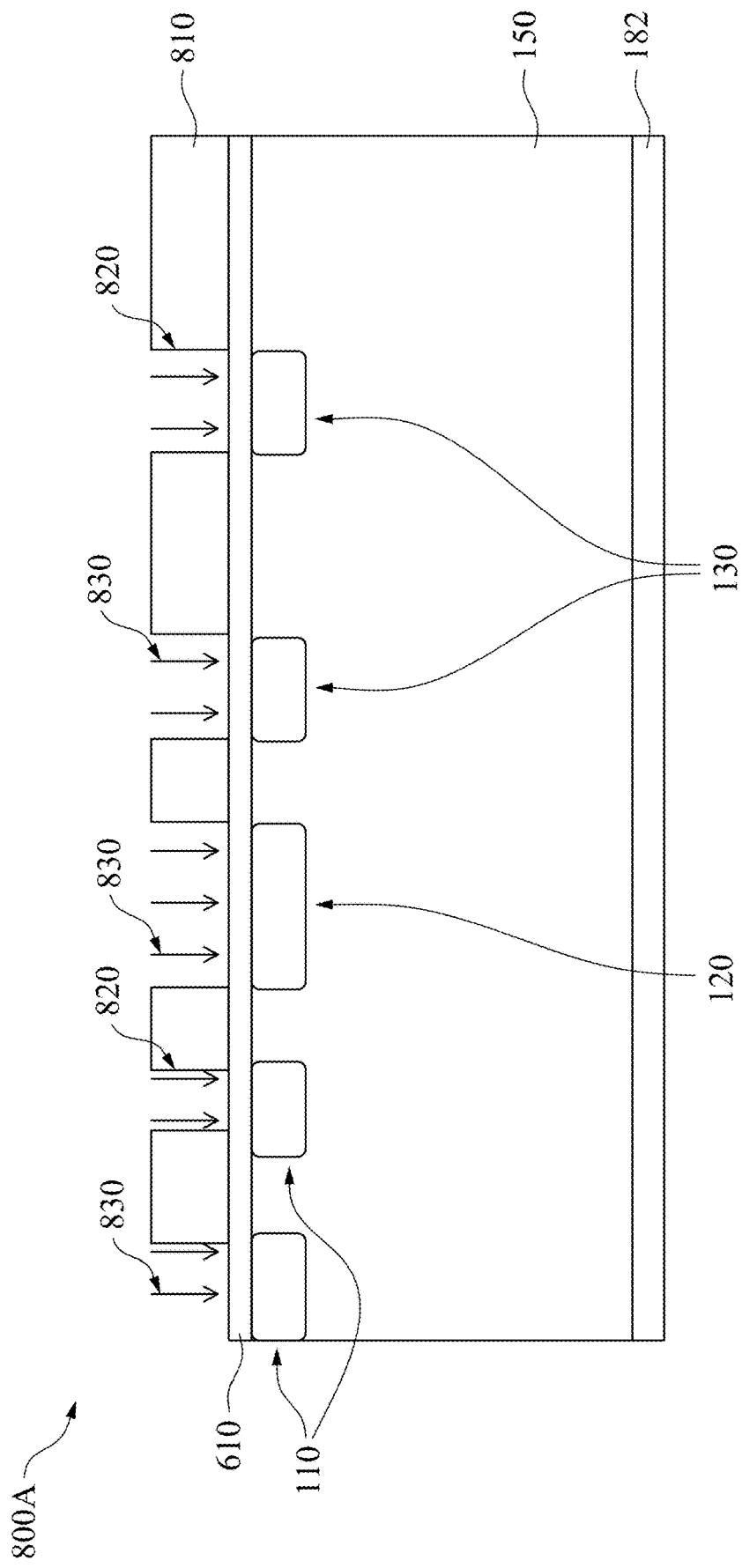
FIGS. 8A-8C are cross-sectional views of a PIN diode detector during various stages of manufacture, in accordance with some embodiments.

FIG. 8A is a cross-sectional view of a PIN diode detector 800A during an intermediate stage of manufacture, in accordance with some embodiments. In some embodiments, the PIN diode detector 800A is a structure produced by operation 715 (FIG. 7). A patterned photoresist 810 is over the substrate 150. The patterned photoresist 810 includes a plurality of openings 820. A second pad oxide 610 is between the patterned photoresist 810 and the substrate 150. An implantation process 830 is performed on the substrate 150 through the openings 820 and the second pad oxide 610 to implant dopants into the substrate 150. The implantation process 830 implants dopants through the openings 820 in order to produce PIN diodes 115, the connecting ring 120 and the plurality of floating rings 130 (FIG. 1B). The implantation process 830 is limited to the portion of the substrate 150 exposed by the openings 820. In some embodiments, the implantation process 830 includes a single process for forming each of the PIN diodes 115, the connecting ring 120 and the plurality of floating rings 130. In some embodiments, a separate implantation process 830 is used to form at least one of the PIN diodes 115, the connecting ring 120 or the plurality of floating rings 130 than used to form another of the PIN diodes 115, the connecting ring 120 or at least one of the floating rings 130.

Returning to FIG. 7, in operation 510, a blanket implantation process is performed to implant dopants having the first dopant type into the front-side of the substrate. The blanket implantation process means that the implantation process is substantially uniform across an entirety of the substrate. In some embodiments, the blanket implantation is performed using an ion implantation process. In some embodiments, the blanket implantation process includes implanting an n-type dopant.

Figure 8B:
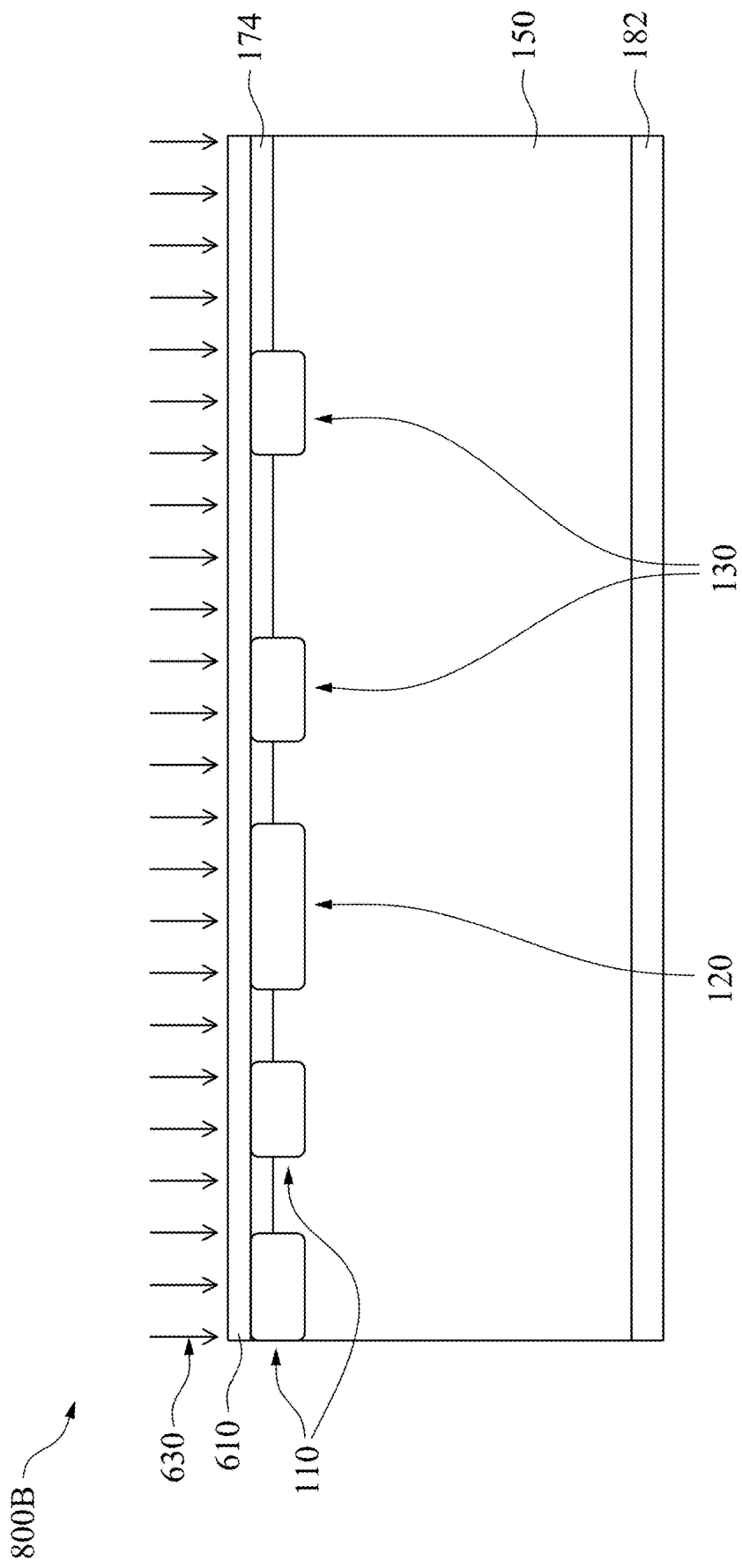

FIG. 8B is a cross-sectional view of a PIN diode detector 800B during an intermediate stage of manufacture, in accordance with some embodiments. In some embodiments, the PIN diode detector 800B is a structure produced by operation 510 (FIG. 7). In comparison with the PIN diode detector 800A, the patterned photoresist 810 is removed from the PIN diode detector 800B. In some embodiments, the patterned photoresist 810 is removed by ashing or another suitable removal process. A blanket implantation process 630, such as the blanket implantation process described with respect to operation 510 (FIG. 5), is performed on the front-side of the substrate 150. The implantation process implants dopants through the second pad oxide layer 610 in order to produce blanket doped region 174. The blanket implantation process 630 is substantially uniform across the substrate 150.

Returning to FIG. 7, in operation 515, a dopant having the first dopant type is implanted into the substrate to form a field ring. A photoresist is formed over the first front-side of the substrate and patterned in order to define a location of the implantation to form the field ring. In some embodiments, the implantation is performed using an ion implantation process. In some embodiments, the implantation process includes implanting an n-type dopant.

Figure 8C:
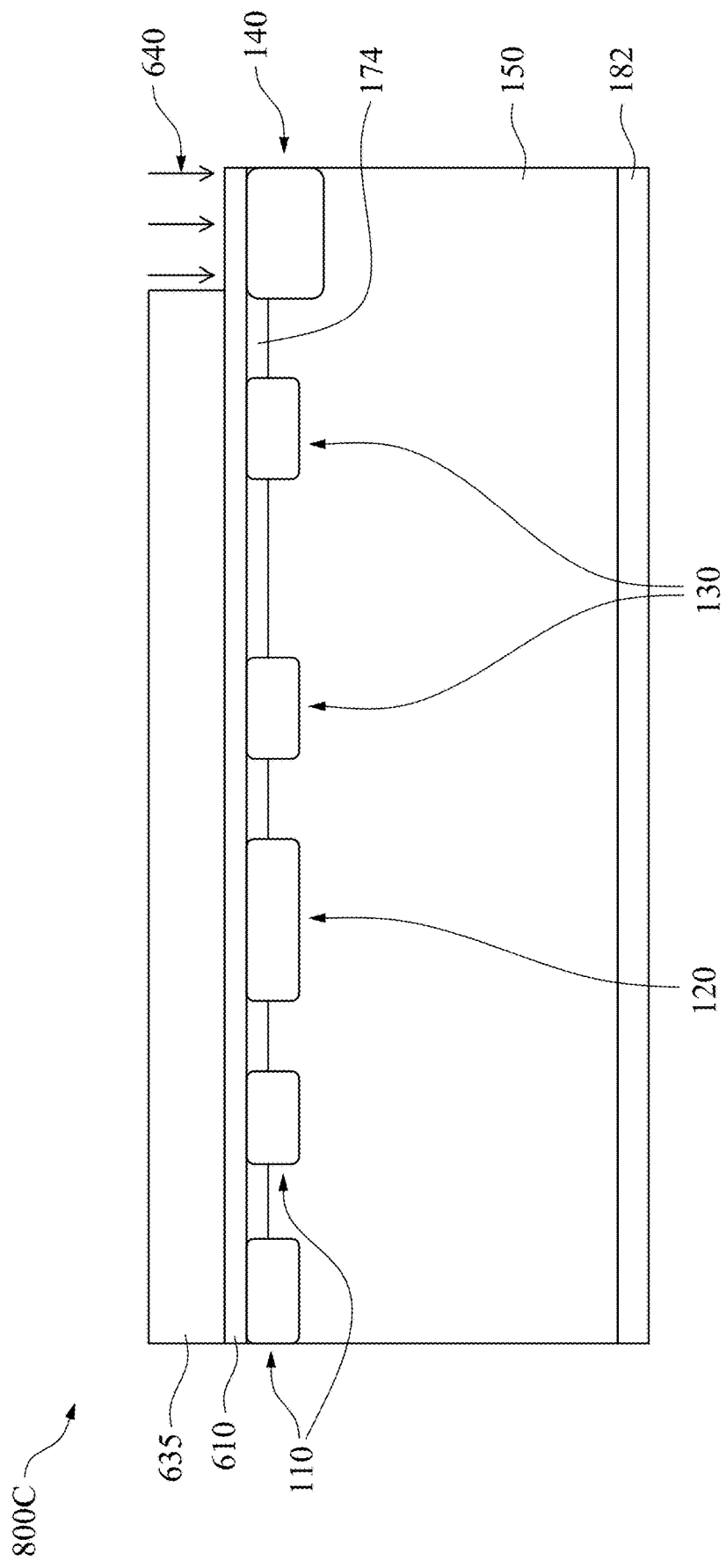

FIG. 8C is a cross-sectional view of a PIN diode detector 800C during an intermediate stage of manufacture, in accordance with some embodiments. In some embodiments, the PIN diode detector 800C is a structure produced by operation 515 (FIG. 7). In comparison with the PIN diode detector 800B, a photoresist 635 has been deposited and patterned for the PIN diode detector 800C. In some embodiments, the photoresist was deposited by spin-on coating, flowable CVD, or another suitable deposition process. In some embodiments, the photoresist was patterned using a lithographic process or another suitable patterning process. An implantation process 640, such as the implantation process described with respect to operation 515 (FIG. 7), is performed on the front-side of the substrate 150. The implantation process 640 implants dopants through the second pad oxide layer 610 in order to produce field stop ring 140. The implantation process 640 is limited to the portion of the substrate 150 exposed by the patterned photoresist 635.

Returning to FIG. 7, in operation 540, an interconnect structure is formed over the substrate. Forming the interconnect structure includes forming an active interconnect structure over PIN diodes, e.g., PIN diodes 115 (FIG. 1B), of the PIN diode detector. In some embodiments, forming the interconnect structure includes forming a dummy interconnect structure electrically connected to wells in the peripheral region of the PIN diode detector.

In operation 545, a wafer is diced through the field stop ring of the substrate in order to separate the PIN diode detector from other PIN diode detectors formed on a same wafer. In some embodiments, the wafer is diced using a saw. In some embodiments, the wafer is diced using a laser. In some embodiments, the wafer is diced using an etching process.

One of ordinary skill in the art would understand that method 700 is not limited to the operations and sequence of operations described above. In some embodiments, at least one additional operation is included in method 700. For example, in some embodiments, the method further includes formation of gate structures for controlling the PIN diodes 115. In some embodiments, at least one operation is omitted from method 700. For example, in some embodiments, the operation 710 is omitted and the implantation processes of operation 715 is controlled to only contact the substrate at select locations using a pre-fabricated mask. In some embodiments, an order of operations of the method 700 is modified. For example, in some embodiments, operation 515 is performed prior to operation 510. In some embodiments, at least one operation is modified. For example, in some embodiments, instead of an implantation process in operation 510, a layer of doped material is deposited on the substrate and then dopants are driven into the substrate using an annealing process.

An aspect of this description relates to a PIN diode detector. The PIN diode detector includes a substrate, wherein the substrate includes a pixel region and a peripheral region, and the peripheral region surrounds the pixel region. The PIN diode detector further includes a plurality of PIN diode wells in the pixel region, wherein each of the plurality of PIN diode wells has a first dopant type. The PIN diode detector further includes a connecting ring well in the peripheral region, wherein the connecting ring well has the first dopant type. The PIN diode detector further includes a plurality of floating ring wells surrounding the connecting ring well, wherein each of the plurality of floating ring wells has the first dopant type. The PIN diode detector further includes a field stop ring well surrounding the plurality of floating ring wells, wherein the field stop ring well has a second dopant type opposite the first dopant type. The PIN diode detector further includes a blanket doped region, wherein the blanket doped region extends continuously through an entirety of the pixel region and an entirety of the peripheral region, and the blanket doped region has the second dopant type. In some embodiments, a depth of the blanket doped region ranges from about 0.5 microns (μm) to about 1.5 μm. In some embodiments, a dopant concentration in the blanket doped region ranges from about $1\times10^{14}$ dopants/cm$^3$ to about $1\times10^{15}$ dopants/cm$^3$. In some embodiments, the substrate includes a diced edge, and the substrate includes a damaged region where a crystal structure of the substrate adjacent to the diced edge is damaged in comparison with a crystal structure of a pixel region of the substrate. In some embodiments, the PIN diode detector further includes a depletion region in the substrate in the pixel region, wherein the depletion region extends into the peripheral region, and an entirety of the depletion region is spaced from the damaged region. In some embodiments, a bottom surface of the depletion region in a central area of the pixel region is substantially planar. In some embodiments, a number of the plurality of floating ring wells ranges from 2 to 10. In some embodiments, the plurality of PIN diode wells is in a two-dimensional array in the pixel region. In some embodiments, each of the plurality of PIN diode wells are configured to detect x-ray radiation.

An aspect of this description relates to a method of making a PIN diode detector. The method includes implanting a plurality of PIN diode wells into a pixel region of a substrate, wherein each of the plurality of PIN diode wells has a first dopant type. The method further includes implanting a connecting ring well into a peripheral region of the substrate, wherein the peripheral region surrounds the pixel region, and the connecting ring well has the first dopant type. The method further includes implanting a plurality of floating ring well into the peripheral region of the substrate, wherein each of the plurality of floating ring wells has the first dopant type. The method further includes implanting a field stop ring well surrounding the plurality of floating ring wells, wherein the field stop ring well has a second dopant type opposite the first dopant type. The method further includes blanket doping the pixel region and the peripheral region of the substrate to define a blanket doped region continuous across the pixel region and the peripheral region, wherein the blanket doped region has the second dopant type. In some embodiments, the blanket doping includes performing ion implantation at a dosage ranging from about $1\times10^{11}$ dopants/cm$^2$ to about $5\times10^{11}$ dopants/cm$^2$. In some embodiments, the blanket doping comprises performing ion implantation at an energy ranging from about 20 kiloelectronvolts (keV) to about 50 keV. In some embodiments, the blanket doping is performed prior to the implanting of the plurality of PIN diode wells. In some embodiments, implanting the field stop ring well includes implanting the field stop ring well prior to implanting the plurality of floating ring wells. In some embodiments, the blanket doping is performed prior to the implanting of the field stop ring well. In some embodiments, the implanting of the PIN diode wells, the implanting of the connecting ring well, and the implanting of the plurality of floating ring wells is performed simultaneously. In some embodiments, the implanting of the plurality of floating ring wells includes implanting the plurality of floating ring wells surrounding the connecting ring well. In some embodiments, the blanket doping includes forming the blanket doped region having a depth ranging from about 0.5 microns (μm) to about 1.5 μm.

An aspect of this description relates to a PIN diode detector system. The system includes a source configured to emit electromagnetic radiation. The system further includes a PIN diode detector configured to detect the electromagnetic radiation. The PIN diode detector includes a substrate, wherein the substrate includes a pixel region and a peripheral region, and the peripheral region surrounds the pixel region. The PIN diode further includes a plurality of PIN diode wells in the pixel region, wherein each of the plurality of PIN diode wells has a first dopant type. The PIN diode further includes a connecting ring well in the peripheral region, wherein the connecting ring well has the first dopant type. The PIN diode further includes a plurality of floating ring wells surrounding the connecting ring well, wherein each of the plurality of floating ring wells has the first dopant type. The PIN diode further includes a field stop ring well surrounding the plurality of floating ring wells, wherein the field stop ring well has a second dopant type opposite the first dopant type. The PIN diode further includes a blanket doped region, wherein the blanket doped region extends continuously through an entirety of the pixel region and an entirety of the peripheral region, and the blanket doped region has the second dopant type. The system further includes a display configured to display an image corresponding to the detected electromagnetic radiation. In some embodiments, the source is configured to emit x-ray radiation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A PIN diode detector comprising:
a substrate, wherein the substrate includes a pixel region and a peripheral region, and the peripheral region surrounds the pixel region;
a plurality of PIN diode wells in the pixel region, wherein each of the plurality of PIN diode wells has a first dopant type;
a connecting ring well in the peripheral region, wherein the connecting ring well has the first dopant type;
a plurality of floating ring wells surrounding the connecting ring well, wherein each of the plurality of floating ring wells has the first dopant type;
a field stop ring well surrounding the plurality of floating ring wells, wherein the field stop ring well has a second dopant type opposite the first dopant type; and a blanket doped region, wherein the blanket doped region extends continuously through an entirety of the pixel region and an entirety of the peripheral region, and the blanket doped region has the second dopant type.

2. The PIN diode detector of claim 1, wherein a depth of the blanket doped region ranges from about 0.5 microns (μm) to about 1.5 μm.

3. The PIN diode detector of claim 1, wherein a dopant concentration in the blanket doped region ranges from about $1\times10^{14}$ dopants/cm$^3$ to about $1\times10^{15}$ dopants/cm$^3$.

4. The PIN diode detector of claim 1, wherein the substrate comprises a diced edge, and the substrate comprises a damaged region where a crystal structure of the substrate adjacent to the diced edge is damaged in comparison with a crystal structure of a pixel region of the substrate.

5. The PIN diode detector of claim 4, further comprising a depletion region in the substrate in the pixel region, wherein the depletion region extends into the peripheral region, and an entirety of the depletion region is spaced from the damaged region.

6. The PIN diode detector of claim 4, wherein a bottom surface of the depletion region in a central area of the pixel region is substantially planar.

7. The PIN diode detector of claim 1, wherein a number of the plurality of floating ring wells ranges from 2 to 10.

8. The PIN diode detector of claim 1, wherein the plurality of PIN diode wells is in a two-dimensional array in the pixel region.

9. The PIN diode detector of claim 1, wherein each of the plurality of PIN diode wells are configured to detect x-ray radiation.

10. A method of making a PIN diode detector, the method comprising:
implanting a plurality of PIN diode wells into a pixel region of a substrate, wherein each of the plurality of PIN diode wells has a first dopant type;
implanting a connecting ring well into a peripheral region of the substrate, wherein the peripheral region surrounds the pixel region, and the connecting ring well has the first dopant type;
implanting a plurality of floating ring well into the peripheral region of the substrate, wherein each of the plurality of floating ring wells has the first dopant type;
implanting a field stop ring well surrounding the plurality of floating ring wells, wherein the field stop ring well has a second dopant type opposite the first dopant type; and
blanket doping the pixel region and the peripheral region of the substrate to define a blanket doped region continuous across the pixel region and the peripheral region, wherein the blanket doped region has the second dopant type.

11. The method of claim 10, wherein the blanket doping comprises performing ion implantation at a dosage ranging from about $1\times10^{11}$ dopants/cm$^2$ to about $5\times10^{11}$ dopants/cm$^2$.

12. The method of claim 10, wherein the blanket doping comprises performing ion implantation at an energy ranging from about 20 kiloelectronvolts (keV) to about 50 keV.

13. The method of claim 10, wherein the blanket doping is performed prior to the implanting of the plurality of PIN diode wells.

14. The method of claim 10, wherein implanting the field stop ring well comprises implanting the field stop ring well prior to implanting the plurality of floating ring wells.

15. The method of claim 10, wherein the blanket doping is performed prior to the implanting of the field stop ring well.

16. The method of claim 10, wherein the implanting of the PIN diode wells, the implanting of the connecting ring well, and the implanting of the plurality of floating ring wells is performed simultaneously.

17. The method of claim 10, wherein the implanting of the plurality of floating ring wells comprises implanting the plurality of floating ring wells surrounding the connecting ring well.

18. The method of claim 10, wherein the blanket doping comprises forming the blanket doped region having a depth ranging from about 0.5 microns (μm) to about 1.5 μm.

19. A PIN diode detector system, the system comprising:
a source configured to emit electromagnetic radiation;
a PIN diode detector configured to detect the electromagnetic radiation, wherein the PIN diode detector comprises:
a substrate, wherein the substrate includes a pixel region and a peripheral region, and the peripheral region surrounds the pixel region;
a plurality of PIN diode wells in the pixel region, wherein each of the plurality of PIN diode wells has a first dopant type;
a connecting ring well in the peripheral region, wherein the connecting ring well has the first dopant type;
a plurality of floating ring wells surrounding the connecting ring well, wherein each of the plurality of floating ring wells has the first dopant type;
a field stop ring well surrounding the plurality of floating ring wells, wherein the field stop ring well has a second dopant type opposite the first dopant type; and
a blanket doped region, wherein the blanket doped region extends continuously through an entirety of the pixel region and an entirety of the peripheral region, and the blanket doped region has the second dopant type; and
a display configured to display an image corresponding to the detected electromagnetic radiation.

20. The system of claim 19, wherein the source is configured to emit x-ray radiation.

\* \* \* \* \*